(12) United States Patent
Fujiki et al.

(10) Patent No.: US 11,888,473 B2
(45) Date of Patent: Jan. 30, 2024

(54) CAPACITANCE TYPE INPUT APPARATUS AND CAPACITANCE TYPE INPUT METHOD

(71) Applicant: ALPS ALPINE CO., LTD., Tokyo (JP)

(72) Inventors: Takashi Fujiki, Fukushima (JP); Kohei Kitagawa, Miyagi (JP)

(73) Assignee: ALPS ALPINE CO., LTD., Tokyo (JP)

(*) Notice: Subject to any disclaimer, the term of this patent is extended or adjusted under 35 U.S.C. 154(b) by 0 days.

(21) Appl. No.: 17/813,356

(22) Filed: Jul. 19, 2022

(65) Prior Publication Data

US 2023/0021660 A1    Jan. 26, 2023

(30) Foreign Application Priority Data

Jul. 26, 2021   (JP) ................................ 2021-121749
Jun. 27, 2022   (JP) ................................ 2022-102618

(51) Int. Cl.
*H03K 17/96*    (2006.01)

(52) U.S. Cl.
CPC ............... *H03K 17/9622* (2013.01); *H03K 2217/960745* (2013.01); *H03K 2217/960755* (2013.01)

(58) Field of Classification Search
CPC .. H01H 13/702; H01H 13/703; H01H 13/704; H01H 2001/12; H01H 2001/145; H01H 2001/14; H01H 2001/5827; H01H 2209/068; H01H 2209/086; H01H 2239/006; H01H 236/00; H01H 2209/024; H01H 2209/00; H01H 2209/038; H01H 2209/074; H01H 2211/024; H01H 2221/002; H01H 2207/004; H01H 2207/016; H01H 2207/01; H01H 2207/04; H03K 17/9622; H03K 17/960745; H03K 17/960755; H03K 17/96

See application file for complete search history.

(56) References Cited

U.S. PATENT DOCUMENTS

| | | | |
|---|---|---|---|
| 9,524,067 B2* | 12/2016 | Soo ........................ | G06F 3/0446 |
| 2013/0063286 A1* | 3/2013 | Elias ...................... | G06F 3/0443 |
| | | | 341/33 |
| 2016/0021266 A1* | 1/2016 | Akagi ................ | H04N 1/00493 |
| | | | 358/1.15 |
| 2018/0101260 A1 | 4/2018 | Morita | |

FOREIGN PATENT DOCUMENTS

JP          2018-063802        4/2018

* cited by examiner

*Primary Examiner* — Anthony R Jimenez
(74) *Attorney, Agent, or Firm* — IPUSA, PLLC

(57) ABSTRACT

A capacitance type input apparatus includes a plurality of touch switches; and a determining unit configured to determine which one touch switch among the plurality of touch switches a touch operation is performed on, based on outputs of the plurality of touch switches. The determining unit performs a first comparison of comparing a first threshold used for determining whether the touch operation has been performed, with each of the outputs of the plurality of touch switches, performs a second comparison of comparing an output that is higher than the first threshold among the outputs of the plurality of touch switches, with a plurality of comparison thresholds that are greater than first threshold and that are different from each other, and determines which one touch switch among the plurality of touch switches the touch operation is performed on, based on a comparison result of the first or second comparison.

11 Claims, 14 Drawing Sheets

FIG.3A

| | COLUMN 1 | COLUMN 2 | COLUMN 3 | COLUMN 4 | COLUMN 5 | COLUMN 6 | COLUMN 7 | COLUMN 8 | COLUMN 9 | COLUMN 10 | COLUMN 11 | COLUMN 12 | COLUMN 13 | COLUMN 14 | COLUMN 15 | COLUMN 16 | COLUMN 17 | COLUMN 18 | COLUMN 19 | COLUMN 20 | COLUMN 21 | COLUMN 22 | COLUMN 23 | COLUMN 24 |
|---|---|---|---|---|---|---|---|---|---|---|---|---|---|---|---|---|---|---|---|---|---|---|---|---|
| ROW 1 | 0 | 0 | 0 | 0 | 1 | 1 | 1 | 1 | 1 | 1 | 1 | 0 | 1 | 1 | 1 | 1 | 1 | 0 | 0 | 0 | 1 | 1 | 1 | 1 |
| ROW 2 | 1 | 1 | 1 | 0 | 0 | 0 | 1 | 0 | 1 | 1 | 1 | 0 | 0 | 0 | 0 | 0 | 1 | 0 | 1 | 1 | 0 | 0 | 1 |
| ROW 3 | 1 | 1 | 1 | 1 | 1 | 1 | 0 | 1 | 1 | | 0 | 1 | 1 | 0 | 0 | 0 | | 1 | 1 | 1 | 1 | 1 | 2 | 1 |
| ROW 4 | 1 | 0 | 1 | 1 | 1 | 1 | 1 | 1 | 1 | | 1 | 1 | 0 | 0 | 0 | 1 | | 1 | 1 | 1 | 0 | 1 | 1 | 1 |
| ROW 5 | 1 | 1 | 1 | 1 | 2 | 3 | 3 | 3 | 2 | | 2 | 1 | 0 | 0 | 0 | 1 | | 1 | 1 | 1 | 1 | 1 | 1 | 1 |
| ROW 6 | 1 | 1 | 2 | 4 | 36 | 57 | 68 | 62 | 41 | | 3 | 2 | 0 | 1 | 1 | 1 | | 1 | 1 | 1 | 1 | 1 | 1 | 1 |
| ROW 7 | 1 | 2 | 4 | 55 | 110 | 168 | 208 | 197 | 150 | | 38 | 4 | 1 | 1 | 1 | 1 | | 1 | 1 | 1 | 1 | 1 | 1 | 1 |
| ROW 8 | 1 | 3 | 45 | 128 | 227 | 329 | 381 | 374 | 320 | | 127 | 45 | 3 | 1 | 0 | 1 | | 1 | 1 | 1 | 1 | 1 | 1 | 1 |
| ROW 9 | 1 | 4 | 83 | 209 | 348 | 473 | 544 | 536 | 441 | | 183 | 72 | 3 | 1 | 1 | 0 | | 1 | 1 | 1 | 1 | 1 | 1 | 1 |
| ROW 10 | 2 | 6 | 121 | 270 | 439 | 581 | 644 | 637 | 509 | | 207 | 75 | 4 | 1 | 1 | 1 | | 1 | 1 | 1 | 1 | 1 | 0 | 1 |
| ROW 11 | 2 | 7 | 133 | 288 | 442 | 572 | 630 | 579 | 451 | | 180 | 61 | 4 | 2 | 2 | 1 | | 1 | 1 | 1 | 1 | 0 | 0 | 0 |
| ROW 12 | 2 | 7 | 128 | 250 | 364 | 458 | 480 | 439 | 350 | | 122 | 41 | 3 | 3 | 2 | 2 | | 0 | 1 | 0 | 0 | 1 | 0 | 1 |
| ROW 13 | 2 | 6 | 84 | 177 | 254 | 313 | 311 | 274 | 227 | | 59 | 5 | 3 | 3 | 2 | 1 | | 0 | 0 | 0 | 1 | 1 | 1 | 1 |
| ROW 14 | 2 | 3 | 31 | 99 | 139 | 159 | 146 | 114 | 64 | | 4 | 3 | 2 | 1 | 1 | 0 | | 1 | 1 | 1 | 0 | 1 | 0 |
| ROW 15 | 1 | 2 | 4 | 7 | 40 | 43 | 33 | 7 | 4 | | 3 | 2 | 1 | 1 | 1 | 1 | | 1 | 1 | 1 | 1 | 0 | 0 | 1 |
| ROW 16 | 1 | 1 | 1 | 2 | 2 | 2 | 2 | 2 | 2 | | 0 | 1 | 1 | 1 | 1 | 1 | | 1 | 0 | 1 | 1 | 1 | 1 | 1 |
| ROW 17 | 1 | 1 | 1 | 1 | 1 | 1 | 1 | 1 | 1 | | 1 | 0 | 1 | 1 | 1 | 1 | | 1 | 1 | 1 | 1 | 1 | 1 | 0 |
| ROW 18 | 1 | 1 | 1 | 1 | 1 | 1 | 0 | 1 | 1 | | 0 | 0 | 1 | 1 | 1 | 1 | | 0 | 1 | 1 | 1 | 0 | 1 | 1 |
| ROW 19 | 0 | 0 | 1 | 1 | 0 | 0 | 1 | 0 | 1 | 1 | 1 | 1 | 0 | 1 | 1 | 1 | 0 | 1 | 0 | 1 | 1 | 1 | 1 | 1 |
| ROW 20 | 1 | 1 | 0 | 0 | 0 | 1 | 0 | 0 | 0 | 0 | 1 | 0 | 0 | 0 | 0 | 1 | 1 | 0 | 1 | 0 | 1 | 0 | 0 |

FIG.3B

| | COLUMN 1 | COLUMN 2 | COLUMN 3 | COLUMN 4 | COLUMN 5 | COLUMN 6 | COLUMN 7 | COLUMN 8 | COLUMN 9 | COLUMN 10 | COLUMN 11 | COLUMN 12 | COLUMN 13 | COLUMN 14 | COLUMN 15 | COLUMN 16 | COLUMN 17 | COLUMN 18 | COLUMN 19 | COLUMN 20 | COLUMN 21 | COLUMN 22 | COLUMN 23 | COLUMN 24 |
|---|---|---|---|---|---|---|---|---|---|---|---|---|---|---|---|---|---|---|---|---|---|---|---|---|
| ROW 1 | 1 | 1 | 0 | 0 | 1 | 1 | 1 | 1 | 1 | 1 | 1 | 1 | 1 | 1 | 0 | 0 | 0 | 0 | 1 | 1 | 1 | 1 | 1 | 1 |
| ROW 2 | 1 | 1 | 0 | 1 | 0 | 0 | 0 | 0 | 1 | 1 | 1 | 0 | 0 | 1 | 1 | 0 | 1 | 1 | 1 | 1 | 1 | 1 | 1 | 2 |
| ROW 3 | 0 | 1 | 1 | 0 | 1 | 1 | 0 | 1 | 1 | 1 | 1 | 0 | 1 | 1 | 1 | 1 | 1 | 1 | 1 | 1 | 1 | 1 | 1 | 1 |
| ROW 4 | 1 | 1 | 1 | 1 | 0 | 1 | 1 | 0 | 1 | 1 | 2 | 1 | 1 | 1 | 1 | 1 | 1 | 1 | 1 | 1 | 1 | 1 | 1 | 2 |
| ROW 5 | 0 | 0 | 1 | 1 | 0 | 0 | 1 | 1 | 2 | 3 | 4 | 3 | 4 | 3 | 3 | 1 | 2 | 2 | 1 | 1 | 1 | 1 | 1 | 2 |
| ROW 6 | 0 | 1 | 1 | 1 | 1 | 1 | 1 | 1 | 2 | 4 | 8 | 48 | 55 | 56 | 46 | 7 | 4 | 3 | 2 | 1 | 1 | 1 | 1 | 1 |
| ROW 7 | 0 | 1 | 1 | 1 | 1 | 1 | 2 | 3 | 5 | 34 | 77 | 110 | 129 | 129 | 106 | 72 | 44 | 4 | 2 | 2 | 1 | 1 | 1 | 1 |
| ROW 8 | 1 | 0 | 1 | 1 | 1 | 1 | 2 | 3 | 34 | | 211 | 301 | 353 | 352 | 288 | 197 | 104 | 6 | 3 | 2 | 1 | 1 | 1 | 0 |
| ROW 9 | 1 | 1 | 1 | 1 | 1 | 2 | 2 | 4 | 66 | 179 | 309 | 422 | 506 | 504 | 409 | 287 | 184 | 58 | 3 | 2 | 2 | 1 | 0 | 1 |
| ROW 10 | 1 | 1 | 1 | 1 | 2 | 1 | 2 | 3 | 79 | 211 | 354 | 489 | 579 | 578 | 465 | 324 | 185 | 66 | 3 | 1 | 1 | 1 | 1 | 1 |
| ROW 11 | 1 | 1 | 1 | 1 | 1 | 2 | 1 | 3 | 73 | 180 | 298 | 409 | 487 | 469 | 382 | 263 | 144 | 44 | 2 | 2 | 1 | 1 | 1 | 0 |
| ROW 12 | 1 | 1 | 1 | 2 | 2 | 2 | 1 | 3 | 49 | 128 | 216 | 299 | 346 | 330 | 264 | 175 | 88 | 5 | 1 | 1 | 1 | 1 | 1 | 1 |
| ROW 13 | 1 | 1 | 1 | 1 | 1 | 1 | 1 | 4 | 1 | 116 | 156 | 156 | 134 | 101 | 63 | 3 | 3 | 1 | 1 | 1 | 1 | 1 | 1 | 1 |
| ROW 14 | 1 | 1 | 1 | 2 | 2 | 2 | 2 | 2 | 1 | 5 | 37 | 42 | 33 | 5 | 4 | 1 | 1 | 1 | 1 | 1 | 1 | 1 | 1 | 0 |
| ROW 15 | 1 | 1 | 1 | 1 | 2 | 2 | 2 | 2 | 2 | 3 | 3 | 3 | 3 | 2 | 2 | 1 | 1 | 1 | 0 | 0 | 0 | 0 | 0 | 1 |
| ROW 16 | 0 | 1 | 1 | 1 | 1 | 1 | 1 | 1 | 2 | 1 | 1 | 1 | 2 | 1 | 1 | 1 | 1 | 0 | 0 | 1 | 1 | 1 | 0 | 0 |
| ROW 17 | 0 | 0 | 1 | 1 | 1 | 1 | 1 | 1 | 1 | 1 | 1 | 1 | 1 | 1 | 1 | 1 | 1 | 0 | 1 | 0 | 1 | 1 | 1 | 0 |
| ROW 18 | 1 | 1 | 1 | 0 | 1 | 1 | 0 | 1 | 0 | 0 | 1 | 0 | 1 | 1 | 1 | 0 | 1 | 1 | 0 | 1 | 1 | 0 | 1 | 1 |
| ROW 19 | 0 | 0 | 1 | 1 | 1 | 1 | 0 | 1 | 1 | 0 | 1 | 1 | 1 | 1 | 0 | 1 | 1 | 0 | 1 | 0 | 1 | 1 | 1 | 1 |
| ROW 20 | 1 | 1 | 0 | 0 | 1 | 0 | 1 | 1 | 1 | 0 | 1 | 0 | 1 | 1 | 0 | 1 | 1 | 1 | 0 | 1 | 0 | 1 | 1 | 1 |

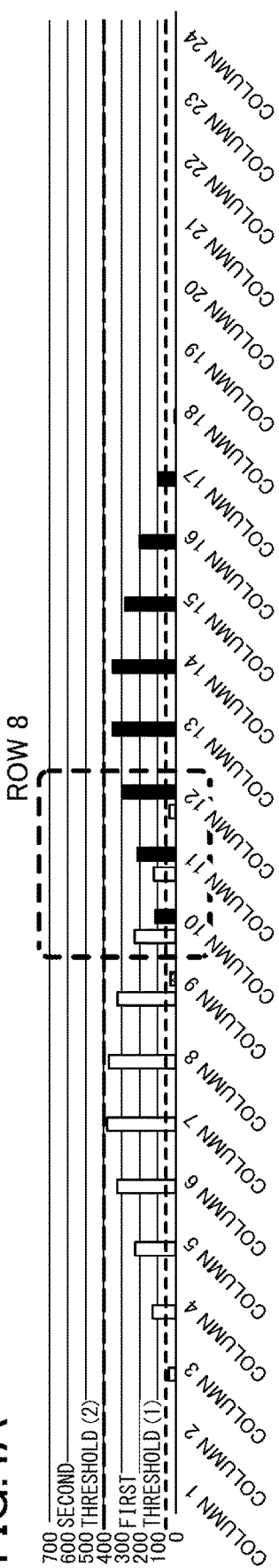
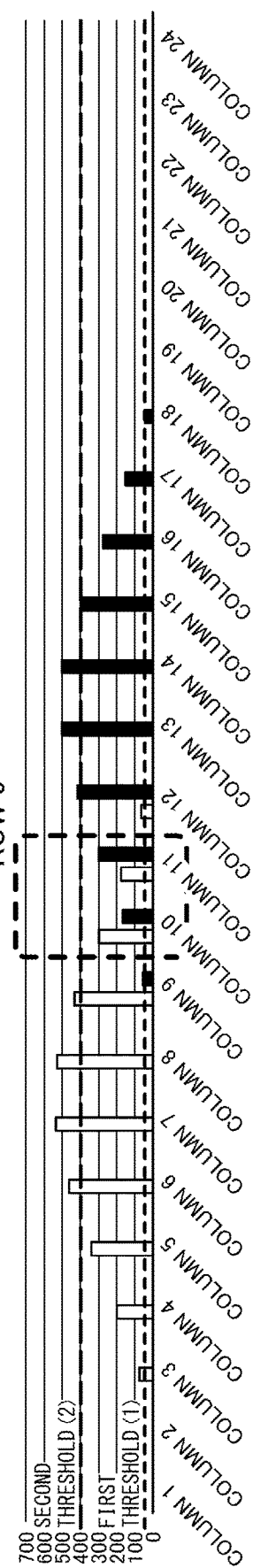
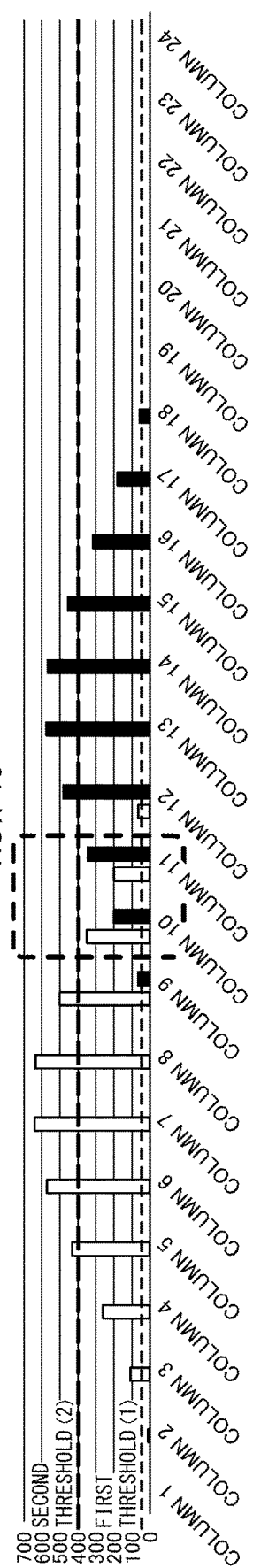
FIG.4A
FIG.4B
FIG.4C

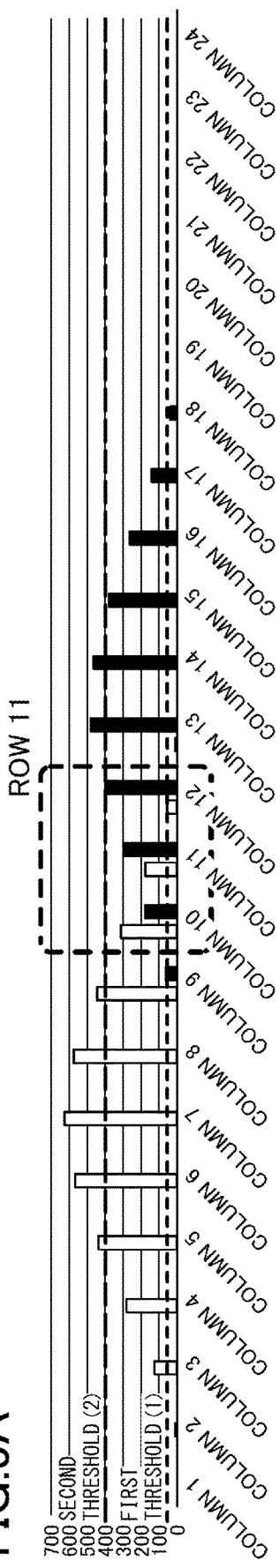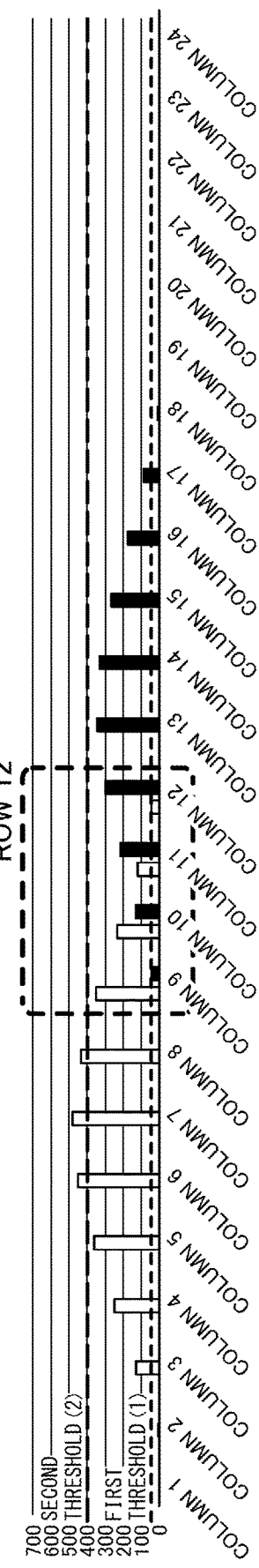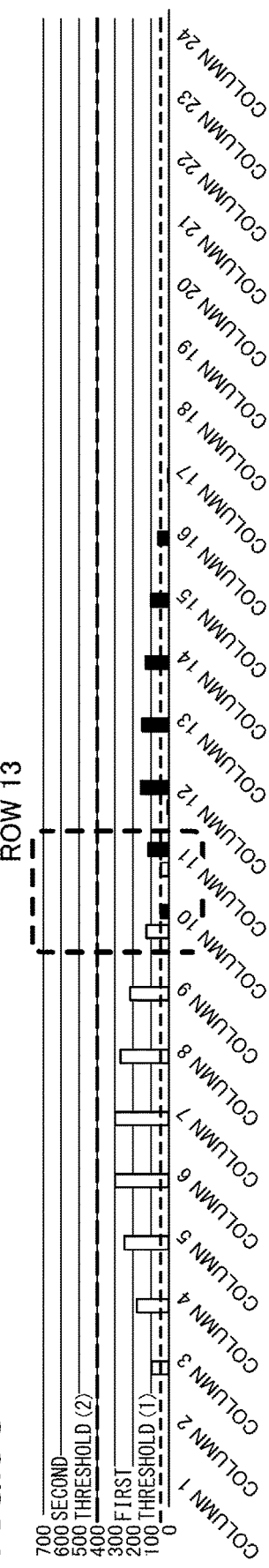

FIG.7A

| | COLUMN 1 | COLUMN 2 | COLUMN 3 | COLUMN 4 | COLUMN 5 | COLUMN 6 | COLUMN 7 | COLUMN 8 | COLUMN 9 | COLUMN 10 | COLUMN 11 | COLUMN 12 | COLUMN 13 | COLUMN 14 | COLUMN 15 | COLUMN 16 | COLUMN 17 | COLUMN 18 | COLUMN 19 | COLUMN 20 | COLUMN 21 | COLUMN 22 | COLUMN 23 | COLUMN 24 |
|---|---|---|---|---|---|---|---|---|---|---|---|---|---|---|---|---|---|---|---|---|---|---|---|---|
| ROW 1 | 0 | 0 | 0 | 0 | 1 | 1 | 1 | 1 | 1 | 1 | 1 | 0 | 1 | 1 | 1 | 1 | 1 | 0 | 0 | 0 | 1 | 1 | 1 | 1 |
| ROW 2 | 1 | 1 | 1 | 0 | 0 | 0 | 1 | 0 | 1 | 1 | 1 | 0 | 0 | 0 | 0 | 0 | 0 | 1 | 0 | 1 | 1 | 0 | 0 | 1 |
| ROW 3 | 1 | 1 | 1 | 1 | 1 | 1 | 0 | 1 | 1 | | 0 | 1 | 1 | 0 | 0 | 0 | | 1 | 1 | 1 | 1 | 1 | 2 | 1 |
| ROW 4 | 1 | 0 | 1 | 1 | 1 | 1 | 1 | 1 | 1 | | 1 | 1 | 0 | 0 | 0 | 1 | | 1 | 1 | 1 | 0 | 1 | 1 | 1 |
| ROW 5 | 1 | 1 | 1 | 1 | 2 | 3 | 3 | 3 | 2 | | 2 | 1 | 0 | 0 | 0 | 1 | | 1 | 1 | 1 | 1 | 1 | 1 | 1 |
| ROW 6 | 1 | 1 | 2 | 4 | 36 | 57 | 68 | 62 | 41 | | 3 | 2 | 0 | 1 | 1 | 1 | | 1 | 1 | 1 | 1 | 1 | 1 | 1 |
| ROW 7 | 1 | 2 | 4 | 55 | 110 | 168 | 208 | 197 | 150 | 99 | 38 | 4 | 1 | 1 | 1 | 1 | | 1 | 1 | 1 | 1 | 1 | 1 | 1 |
| ROW 8 | 1 | 3 | 45 | 128 | 227 | 323 | 361 | 374 | 326 | 127 | 45 | 3 | 1 | 0 | 1 | | | 1 | 1 | 1 | 1 | 1 | 1 | 1 |
| ROW 9 | 1 | 4 | 83 | 209 | 348 | 478 | | 586 | 441 | 182 | 183 | 72 | 3 | 1 | 1 | 0 | 1 | 1 | 1 | 1 | 1 | 1 | 1 | 1 |
| ROW 10 | 2 | 6 | 121 | 270 | 439 | 581 | 644 | 63 | 509 | 229 | 207 | 75 | 4 | 1 | 1 | 1 | | 1 | 1 | 1 | 1 | 1 | 0 | 1 |
| ROW 11 | 2 | 7 | 133 | 288 | 442 | 572 | 630 | 575 | 451 | 236 | 180 | 61 | 4 | 2 | 2 | 1 | | 1 | 1 | 1 | 1 | 1 | 0 | 0 |
| ROW 12 | 2 | 7 | 128 | 250 | 366 | 458 | 480 | 459 | 350 | 233 | 122 | 41 | 3 | 3 | 2 | 1 | | 0 | 1 | 0 | 0 | 1 | 0 | 1 |
| ROW 13 | 2 | 6 | | | | | | | | | 56 | 5 | 3 | 2 | 1 | 1 | | | | | | | | |
| ROW 14 | 2 | 3 | 81 | 99 | 139 | 159 | 146 | 114 | 64 | | 4 | 3 | 2 | 1 | 1 | 1 | 0 | 1 | 1 | 1 | 1 | 0 | 1 | 0 |
| ROW 15 | 1 | 2 | 4 | 7 | 40 | 43 | 33 | 7 | 4 | | 3 | 2 | 1 | 1 | 1 | 1 | | 1 | 1 | 1 | 1 | 0 | 0 | 1 |
| ROW 16 | 1 | 1 | 1 | 2 | 2 | 2 | 2 | 2 | 2 | | 0 | 1 | 1 | 1 | 1 | 1 | | 1 | 0 | 1 | 1 | 1 | 1 | 1 |
| ROW 17 | 1 | 1 | 1 | 1 | 1 | 1 | 1 | 1 | 1 | | 1 | 0 | 1 | 1 | 1 | 1 | | 1 | 1 | 1 | 1 | 1 | 1 | 0 |
| ROW 18 | 1 | 1 | 1 | 1 | 1 | 1 | 0 | 1 | 1 | | 0 | 0 | 1 | 1 | 1 | 1 | | 0 | 1 | 1 | 1 | 0 | 1 | 1 |
| ROW 19 | 0 | 0 | 1 | 1 | 0 | 0 | 1 | 0 | 1 | 1 | 1 | 0 | 1 | 1 | 1 | 0 | 1 | 0 | 1 | 1 | 1 | 1 | 1 | 1 |
| ROW 20 | 1 | 1 | 0 | 0 | 0 | 1 | 0 | 0 | 0 | 0 | 0 | 1 | 0 | 0 | 0 | 0 | 1 | 1 | 0 | 1 | 0 | 1 | 0 | 0 |

FIG.7B

| | COLUMN 1 | COLUMN 2 | COLUMN 3 | COLUMN 4 | COLUMN 5 | COLUMN 6 | COLUMN 7 | COLUMN 8 | COLUMN 9 | COLUMN 10 | COLUMN 11 | COLUMN 12 | COLUMN 13 | COLUMN 14 | COLUMN 15 | COLUMN 16 | COLUMN 17 | COLUMN 18 | COLUMN 19 | COLUMN 20 | COLUMN 21 | COLUMN 22 | COLUMN 23 | COLUMN 24 |
|---|---|---|---|---|---|---|---|---|---|---|---|---|---|---|---|---|---|---|---|---|---|---|---|---|
| ROW 1 | 1 | 1 | 0 | 0 | 1 | 1 | 1 | 1 | 1 | 1 | 1 | 1 | 1 | 0 | 0 | 0 | 0 | 1 | 1 | 1 | 1 | 1 | | |
| ROW 2 | 1 | 1 | 0 | 1 | 0 | 0 | 0 | 0 | 0 | 1 | 1 | 0 | 0 | 1 | 1 | 0 | 1 | 1 | 1 | 1 | 1 | 2 | | |
| ROW 3 | 0 | 1 | 1 | 0 | 1 | 1 | 0 | 1 | 1 | 1 | 1 | 0 | 1 | 1 | 1 | 1 | 1 | 1 | 1 | 1 | 1 | 1 | | |
| ROW 4 | 1 | 1 | 1 | 1 | 0 | 1 | 1 | 0 | 1 | 1 | 2 | 1 | 1 | 1 | 1 | 1 | 1 | 1 | 1 | 1 | 1 | 2 | | |
| ROW 5 | 0 | 0 | 1 | 1 | 0 | 0 | 1 | 1 | 2 | 3 | 4 | 3 | 4 | 3 | 3 | 2 | 2 | 1 | 1 | 1 | 1 | 2 | | |
| ROW 6 | 0 | 1 | 1 | 1 | 1 | 1 | 1 | 2 | 4 | 8 | 48 | 55 | 56 | 46 | 7 | 4 | 3 | 2 | 1 | 1 | 1 | 1 | | |
| ROW 7 | 0 | 1 | 1 | 1 | 1 | 1 | 2 | 3 | 5 | 34 | 77 | 110 | 129 | 129 | 106 | 72 | 48 | 4 | 2 | 1 | 1 | 1 | | |
| ROW 8 | 1 | 0 | 1 | 1 | 1 | 1 | 2 | 3 | 34 | 71 | | | | | 287 | 197 | 6 | 3 | 1 | 1 | 1 | 0 | | |
| ROW 9 | 1 | 1 | 1 | 1 | 1 | 2 | 2 | 4 | 66 | 170 | 309 | 402 | 505 | 400 | 287 | 180 | 58 | 3 | 2 | 2 | 1 | 0 | 1 | |
| ROW 10 | 1 | 1 | 1 | 1 | 2 | 1 | 2 | 3 | 79 | 210 | 354 | 489 | 579 | 578 | 465 | 324 | 129 | 66 | 3 | 1 | 1 | 1 | 1 | |
| ROW 11 | 1 | 1 | 1 | 1 | 1 | 2 | 1 | 3 | 73 | 190 | 298 | 409 | 487 | 469 | 382 | 263 | 120 | 44 | 2 | 2 | 1 | 1 | 0 | |
| ROW 12 | 1 | 1 | 1 | 2 | 2 | 2 | 1 | 2 | 49 | 128 | 216 | 299 | 330 | 311 | 261 | 175 | 88 | 5 | 1 | 1 | 1 | 1 | 1 | |
| ROW 13 | 1 | 1 | 1 | 1 | 1 | 1 | 1 | 2 | 1 | | | | | | | | 1 | 1 | 1 | 1 | 1 | 1 | | |
| ROW 14 | 1 | 1 | 1 | 2 | 2 | 2 | 2 | 2 | 1 | 5 | 37 | 42 | 33 | 5 | 4 | 1 | 1 | 1 | 1 | 1 | 1 | 0 | | |
| ROW 15 | 1 | 1 | 1 | 1 | 2 | 2 | 2 | 2 | 1 | 3 | 3 | 3 | 3 | 2 | 2 | 1 | 1 | 1 | 0 | 0 | 0 | 1 | | |
| ROW 16 | 0 | 1 | 1 | 1 | 1 | 1 | 1 | 2 | 1 | 1 | 1 | 1 | 2 | 1 | 1 | 1 | 1 | 0 | 0 | 1 | 1 | 1 | 0 | |
| ROW 17 | 0 | 0 | 1 | 1 | 1 | 1 | 1 | 1 | 1 | 1 | 1 | 1 | 1 | 1 | 1 | 1 | 0 | 1 | 0 | 1 | 1 | 0 | | |
| ROW 18 | 1 | 1 | 1 | 0 | 1 | 1 | 0 | 1 | 0 | 1 | 1 | 0 | 1 | 1 | 1 | 1 | 1 | 0 | 1 | 1 | 0 | 1 | | |
| ROW 19 | 0 | 0 | 1 | 1 | 1 | 1 | 1 | 0 | 1 | 1 | 0 | 1 | 1 | 1 | 1 | 0 | 1 | 1 | 0 | 1 | 0 | 1 | 1 | |
| ROW 20 | 1 | 1 | 0 | 0 | 1 | 0 | 1 | 1 | 1 | 0 | 1 | 0 | 1 | 1 | 0 | 1 | 1 | 0 | 1 | 0 | 1 | 0 | 1 | |

CAPACITANCE TYPE INPUT APPARATUS AND CAPACITANCE TYPE INPUT METHOD

CROSS-REFERENCE TO RELATED APPLICATION

The present application is based on and claims priority under 35 U.S.C. § 119 to Japanese Patent Application No. 2021-121749, filed on Jul. 26, 2021 and Japanese Patent Application No. 2022-102618, filed on Jun. 27, 2022, the contents of which are incorporated herein by reference in their entirety.

BACKGROUND OF THE INVENTION

1. Field of the Invention

The present invention relates to a capacitance type input apparatus and a capacitance type input method.

2. Description of the Related Art

Conventionally, there has been a capacitance type touch switch apparatus including a touch electrode, a touch detection circuit for outputting a touch detection signal indicating whether or not a touch operation is performed on a touch switch, and a threshold specification circuit for supplying a threshold specification signal for specifying a threshold to the touch detection circuit. The threshold is set lower at the time of receiving a touch operation, and after receiving a touch operation, the threshold is set higher to accelerate the response to the touch operation (see, for example, Patent Document 1).

[Patent Document 1] Japanese Laid-open Patent Publication No. 2018-063802

SUMMARY OF THE INVENTION

According to one aspect of the present invention, there is provided a capacitance type input apparatus including a plurality of touch switches; and a determining unit configured to determine which one touch switch among the plurality of touch switches a touch operation is performed on, based on outputs of the plurality of touch switches, wherein the determining unit performs a first comparison of comparing a first threshold used for determining whether the touch operation has been performed, with each of the outputs of the plurality of touch switches, performs a second comparison of comparing an output that is higher than the first threshold among the outputs of the plurality of touch switches, with a plurality of comparison thresholds that are greater than first threshold and that are different from each other, and determines which one touch switch among the plurality of touch switches the touch operation is performed on, based on a comparison result obtained by the first comparison or the second comparison.

BRIEF DESCRIPTION OF THE DRAWINGS

FIGS. 3A and 3B are diagrams illustrating a distribution of the capacitance of touch switches when touch operations are performed separately on two different touch switches according to an embodiment;

FIGS. 4A to 4C illustrate bar graphs indicating the capacitance in rows 8 to 10 from the top in an area of 20 rows aligned in the vertical direction×24 columns aligned in the horizontal direction in FIGS. 3A and 3B;

FIGS. 5A to 5C illustrate bar graphs indicating the capacitance in rows 11 to 13 from the top in an area of 20 rows aligned in the vertical direction×24 columns aligned in the horizontal direction in FIGS. 3A and 3B;

FIGS. 7A and 7B are diagrams illustrating a threshold used in the determination process of the capacitance type input apparatus according to an embodiment;

DETAILED DESCRIPTION OF THE PREFERRED EMBODIMENTS

When the threshold designation circuit of the conventional capacitance type touch switch apparatus is applied to a plurality of touch switches arranged adjacent to each other, the threshold at the time of receiving a touch operation is very low, and, therefore, it will be determined that a touch operation is performed simultaneously on a plurality of touch switches, and thus it is difficult to determine which touch switch among the plurality of touch switches the touch operation is performed on.

Therefore, an object of the present invention is to provide a capacitance type input apparatus and a capacitance type input method capable of determining which touch switch among a plurality of touch switches a touch operation is performed on.

Hereinafter, a capacitance type input apparatus and a capacitance type input method according to an embodiment of the present invention will be described.

EMBODIMENT

Figure 1:
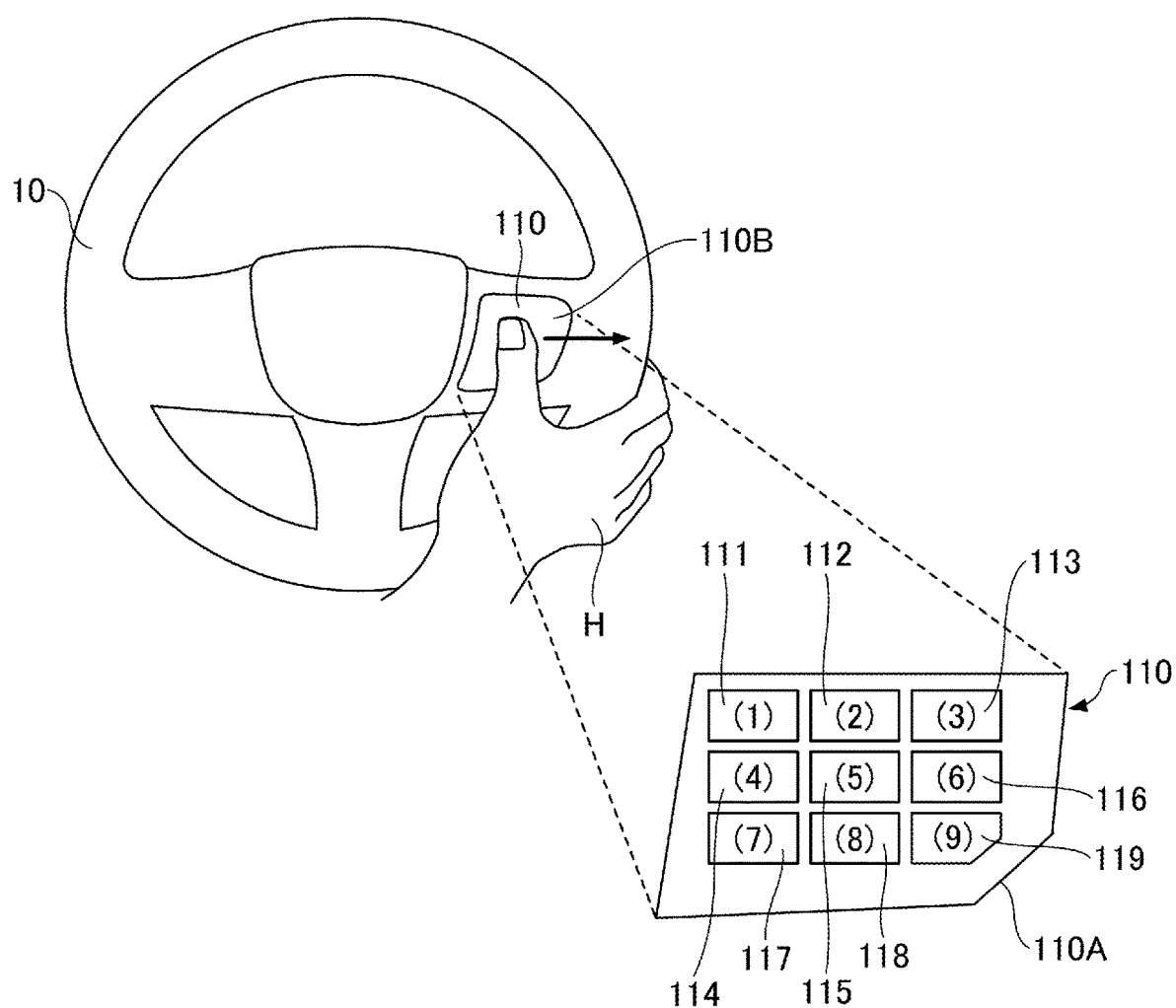
FIG. 1 illustrates a steering wheel provided with an operation unit of a capacitance type input apparatus according to an embodiment.

FIG. 1 is a diagram illustrating a steering wheel 10 provided with an operation unit 110 of a capacitance type input apparatus according to an embodiment. The steering wheel 10 is positioned at the operator's seat of a vehicle and the operation unit 110 is provided on the spoke of the steering wheel 10. FIG. 1 illustrates, as an example, a state in which the operation unit 110 is operated with the thumb of the user's right hand H.

The vehicle is an automotive vehicle capable of running on a road by being powered by an engine and/or a motor or the like. The vehicle may be equipped with self-driving functions of various levels as defined, for example, by the Society of Automotive Engineers (SAE) International of the U.S.

The operation unit 110 includes nine touch switches 111 to 119 as an example, as indicated in the enlarged view. In the enlarged view illustrating the touch switches 111 to 119, a cover covering the touch switches 111 to 119 is omitted. The touch switches 111 to 119 are an example of a plurality of touch switches. Here, (1) to (9) are described as the respective areas in which the touch switches 111 to 119 are disposed.

The touch switches 111 to 119 are housed in a housing 110A and are provided on the spoke of the steering wheel 10 with a cover 110B mounted on the operation surface on the front side of FIG. 1.

The touch switches 111 to 119 are arranged in a substantially matrix-like manner with three rows aligned in a vertical direction×three columns aligned in a horizontal direction. The touch switches 111 to 119 are, for example, electrodes made of metal foil, a metal plate, a conductive film, or the like, and the touch switches 111 to 119 are connected to a control device (not illustrated) through wiring, cables, or the like. The capacitance between the touch switches 111 to 119 and the hand H (see FIG. 1) varies with the degree of proximity (distance) of the hand H to the touch switches 111 to 119.

The touch switches 111 to 119 are used, for example, to operate various kinds of electrical devices in a vehicle. The desired electrical device of the vehicle can be operated by touching a portion of the surface of the cover 110B on any of the touch switches 111 to 119 with a fingertip or the like. The functions of electrical devices that can be operated with the touch switches 111 to 119 include, for example, audio selection, volume adjustment, on-hook or end selection of a hands-free phone, setting up cruise control, or the like.

Figure 2:
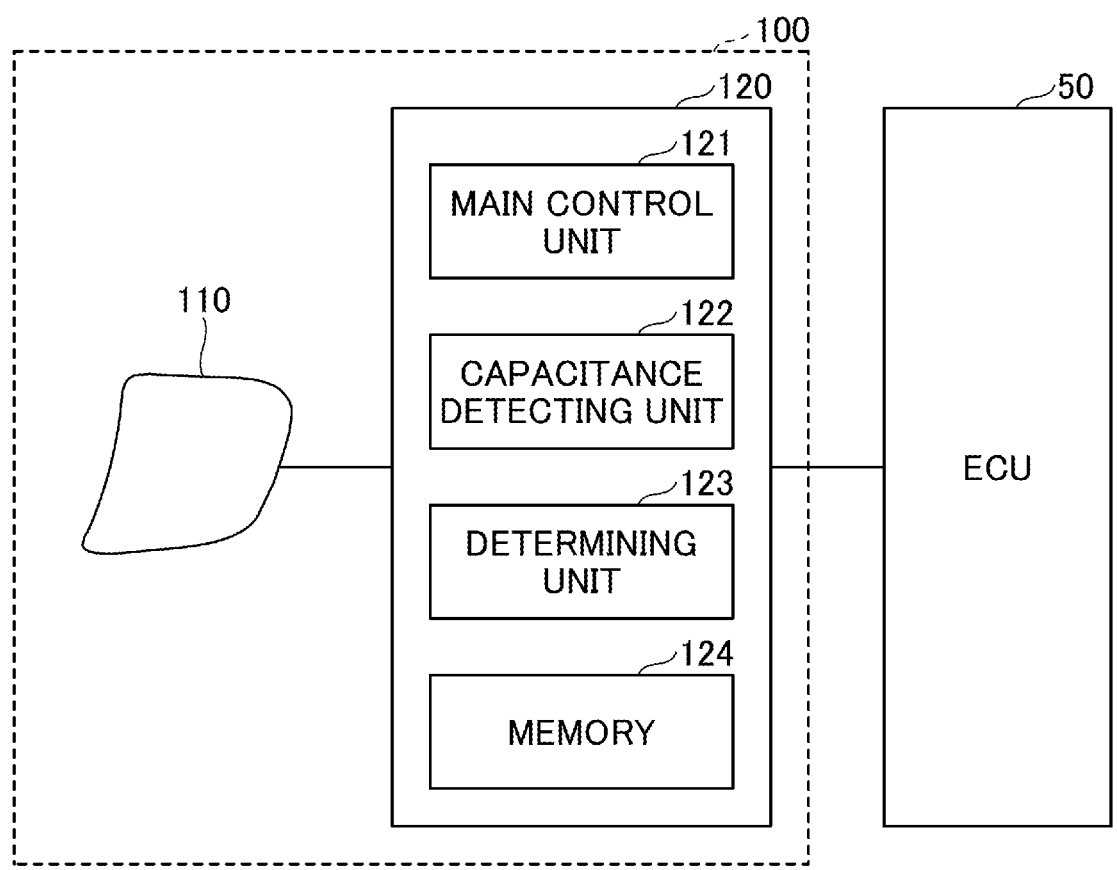
FIG. 2 is a diagram illustrating an embodiment of a capacitance type input apparatus according to an embodiment.

FIG. 2 is a diagram illustrating a capacitance type input apparatus 100 according to an embodiment. The capacitance type input apparatus 100 includes the operation unit 110 and a control device 120. The operation unit 110 includes the touch switches 111 to 119 (see FIG. 1), which are omitted in FIG. 2. The capacitance type input apparatus 100 detects a touch operation performed on the touch switches 111 to 119 by a self-capacitance method as an example.

The operation unit 110 and the control device 120 are connected to each other through wiring, cables, or the like. The control device 120 is provided, for example, in the steering wheel 10 and is integrally configured with the operation unit 110. Here, although the control device 120 is provided with the operation unit 110 as an example and is integrally configured with the operation unit 110, the control device 120 may be configured separately from the operation unit 110 and may be provided in the interior of the vehicle outside the steering wheel 10.

The control device 120 is connected to an electronic control unit (ECU) 50 which controls the electrical devices through an in-vehicle network such as a controller area network (CAN) or a local interconnect network (LIN) mounted in the vehicle. The ECU 50 is an electronic control device that controls the vehicle's audio, the hands-free phone, the cruise control, and other electrical devices. Although FIG. 2 illustrates one ECU 50, a plurality of ECUs 50 may be connected to the control device 120.

The control device 120 is implemented by a computer including a CPU (Central Processing Unit), a RAM (Random Access Memory), a ROM (Read Only Memory), an input/output interface, and an internal bus.

The control device 120 includes a main control unit 121, a capacitance detecting unit 122, a determining unit 123, and a memory 124. The main control unit 121, the capacitance detecting unit 122, and the determining unit 123 represent the functions of programs executed by the control device 120 as functional blocks. The memory 124 is a functional representation of the memory of the control device 120.

The main control unit 121 is a processing unit that controls the control processing of the control device 120 and performs processing other than the processing performed by the capacitance detecting unit 122 and the determining unit 123.

The capacitance detecting unit 122 detects the capacitance at the touch switches 111 to 119 (see FIG. 1) and transmits data indicating the count value of the capacitance of each of the touch switches 111 to 119 to the determining unit 123. The count value of the capacitance represents the change from a reference value when the touch switches 111 to 119 are not operated, and the count value represents the difference obtained by subtracting the reference value from the capacitance while the touch switch is operated. Hereinafter, the capacitance refers to the difference with respect to the reference value. The capacitance of the touch switches 111 to 119 is an example of the output of the touch switches 111 to 119. Each of the touch switches 111 to 119 provides one count value that indicates the capacitance at each of the touch switches 111 to 119.

The determining unit 123 determines that a touch operation is performed on any one of the touch switches 111 to 119 based on the count value of the capacitance of each of the touch switches 111 to 119 transmitted from the capacitance detecting unit 122. The determination result of the determining unit 123 indicates the touch switch on which a touch operation has been performed among the touch switches 111 to 119. The determination result of the determining unit 123 is a detection result of the detection performed by the capacitance type input apparatus 100 to detect the touch switch on which the touch operation has been performed. The determination process performed by the determining unit 123 will be described later.

The memory 124 stores programs, data, etc., necessary for the control device 120 to perform the determination process. The memory 124 stores data indicating a count value of the capacitance of each of touch switches 111 to 119, data generated in the process of the determination process by the determining unit 123, and the like.

Here, there may be various demands for sensitivity when the capacitance type input apparatus 100 detects touch operations performed on the touch switches 111 to 119. For example, if a vehicle, designed with the expectation that the vehicle will be used in a cold climate, is equipped with the capacitance type input apparatus 100, a glove may be fitted over the hand H when operating the steering wheel 10 and the operation unit 110. In such a case, the count value of the capacitance of each of the touch switches 111 to 119 tends to be small, and, therefore, the threshold used in the determination process by the determining unit 123 is lowered. This is done to improve the sensitivity in detecting a touch operation when the hand is wearing a glove. However, if the threshold is lowered, there is a possibility that the count value obtained by an adjacent touch switch exceeds the threshold as well, in addition to the count value obtained by the touch switch on which the touch operation is performed, and, therefore, it is necessary to devise an approach to address this issue.

As an approach to address this issue, in the determination process by the determining unit 123 according to the embodiment, in order to identify one touch switch that is touched among the touch switches 111 to 119, three or more thresholds (three or more levels) are used to facilitate the comparison of the magnitude of the capacitance of the touch switches that are adjacent to each other. Here, before describing the determination process by the determining unit 123 according to the embodiment, the determination process for comparison will be described with reference to FIGS. 3A to 6C. In the determination process for comparison, two thresholds (two levels) are used to identify one touch switch that has been touched among the touch switches 111 to 119.

FIGS. 3A and 3B are diagrams illustrating a distribution of the capacitance of the touch switches 111 to 119 when touch operations are performed separately on the touch switch 114 and on the touch switch 115. FIG. 3A illustrates a distribution of the capacitance on the touch switches 111 to 119 when a touch operation is performed on a center portion of the touch switch 114, and FIG. 3B illustrates a distribution of the capacitance on the touch switches 111 to 119 when a touch operation is performed on a center portion of the touch switch 115. The capacitance is expressed by a count value.

FIG. 3A and FIG. 3B illustrate 480 capacitance values of 480 areas obtained, for example, by dividing, at 3 mm intervals, a rectangularly shaped area including the entire surface of the touch switches 111 to 119 in a planar view, into 480 areas constituted by 20 rows aligned in the vertical direction×24 columns aligned in the horizontal direction, and analyzing the 480 areas to obtain 480 capacitance values thereof. At each of the actual touch switches 111 to 119, a single count value indicating the capacitance is obtained; however, here, in order to analyze the distribution of capacitance in more detail, 480 capacitance values obtained from the analysis of 480 areas are described. More specifically, FIG. 3A illustrates the output of the touch switch 114. The output of the touch switch 114 illustrated in FIG. 3A is the output of the touch switch 114 when a touch operation is performed in each of the 480 areas. Similarly, FIG. 3B illustrates the output of the touch switch 115. The output of the touch switch 115 illustrated in FIG. 3B is the output of the touch switch 115 when a touch operation is performed in each of the 480 areas.

In FIG. 3A, when a touch operation is performed in each of the 480 areas, the touch switch 114 outputs a higher capacitance as a touch operation is performed in the areas in the center portion of the touch switch 114, and the touch switch 114 outputs a lower capacitance as a touch operation is performed in the areas away from the center portion of the touch switch 114. The same applies to the touch switch 115 in FIG. 3B.

FIGS. 3A and 3B illustrate areas where the capacitance exceeds the first threshold (1) in gray. The first threshold (1) is the threshold used to determine whether a touch operation has been performed, with respect to the nine capacitance values actually obtained at the touch switches 111 to 119. The first threshold (1) is a low value that enables the determination of whether a touch operation has been performed even when the hand H is wearing a glove.

As illustrated in FIG. 3A, when a touch operation is performed in each of the 480 areas, the areas that are determined to have received a touch operation based on the first threshold (1) based on the output of the touch switch 114, extend to the outside of the touch switch 114. That is, even if a touch operation is performed outside the touch switch 114 in an area located near the touch switch 114, the output of the touch switch 114 will exceed the first threshold. Similarly, as illustrated in FIG. 3B, when a touch operation is performed in each of the 480 areas, the areas determined to have received a touch operation based on the first threshold (1) based on the output of the touch switch 115, extend to the outside of the touch switch 115. That is, even if a touch operation is performed outside the touch switch 115 in an area located near the touch switch 115, the output of the touch switch 115 will exceed the first threshold. The reason why the areas for which a touch operation is determined to have been performed based on the first threshold (1) extend to the outside of the touch switches 114 and 115 as described above, is because the first threshold (1) is a low value that enables the determination of whether a touch operation is performed even when the hand H is wearing a glove.

Therefore, when a touch operation is performed in an area of the touch switch 114, it may be erroneously determined that a touch operation is performed on the touch switches 111, 112, 115, 117, and 118 adjacent to the touch switch 114. Touch switches adjacent to the touch switch 114 are the touch switches 111, 112, 115, 117, and 118 located adjacent to the touch switch 114 in the horizontal and vertical directions of the touch switch 114 and adjacent to the touch switch 114 in the oblique direction. That is, when touch operations are performed in the areas of the touch switches 111, 112, 115, 117, and 118 adjacent to the touch switch 114, it may be erroneously determined that a touch operation is performed on the touch switch 114.

Similarly, when a touch operation is performed on the touch switch 115, it may be erroneously determined that a touch operation is performed on the touch switches 111, 112, 113, 114, 116, 117, and 118 adjacent to the touch switch 115. Touch switches adjacent to the touch switch 115 are the touch switches 111, 112, 113, 114, 116, 117, and 118 located adjacent to the touch switch 115 in the horizontal and vertical directions of the touch switch 115 and adjacent to the touch switch 115 in the oblique direction.

As described above, if there was only the first threshold (1), it may be difficult to determine whether a touch operation has been performed on one of the touch switches 111 to 119. Therefore, in the determination process for comparison, a second threshold (2) having a larger value than the first threshold (1) is used.

FIGS. 4A to 4C are bar graphs illustrating the capacitance in the 8th to 10th rows from the top, in the area of 20 rows aligned in the vertical direction×24 columns aligned in the horizontal direction of FIGS. 3A and 3B. The capacitance of the touch switch 114 is indicated by a white bar graph, and the capacitance of touch switch 115 is indicated by a black bar graph. In FIGS. 4A to 4C, the horizontal direction indicates the capacitance of columns 1 to 24 from the left among the areas of 20 rows aligned in the vertical direction× 24 columns aligned in the horizontal direction in FIGS. 3A and 3B. Column 24 is the rightmost column of the area of 20 rows aligned in the vertical direction×24 columns aligned in the horizontal direction.

FIGS. 4A to 4C illustrate the second threshold (2) in addition to the first threshold (1). The second threshold (2) is higher than the first threshold (1). In the comparison determination process, the second threshold (2) is used such that when only one capacitance value exceeds the second threshold (2) among the nine capacitance values obtained at the touch switches 111 to 119, it is determined that the touch operation is performed on the touch switch where that one capacitance value is obtained.

As described above, the second threshold (2) having a larger value than the first threshold (1) is used in addition to the first threshold (1) to identify the touch switch on which the touch operation is performed in the determination process for comparison. However, a problem may arise when a capacitance exceeding the second threshold (2) is not obtained. The method and problem of identifying one touch switch on which a touch operation is performed when there is no capacitance exceeding the second threshold (2) in the determination process for comparison, will be described later with reference to FIGS. 6A to 6C.

In row 8, no capacitance exceeding the second threshold (2) is obtained, and both the touch switches 114 and 115 exceed the first threshold (1) in columns 10 to 12, which are enclosed by a square of dashed lines.

In row 9, a capacitance exceeding the second threshold (2) is obtained, but in columns 10 and 11, which are enclosed by a square of dashed lines, both the touch switches 114 and 115 exceed the first threshold (1), but both do not exceed the second threshold (2).

In row 10, a capacitance exceeding the second threshold (2) is obtained, but in columns 10 and 11, which are enclosed by a square of dashed lines, both the touch switches 114 and 115 exceed the first threshold (1), but both do not exceed the second threshold (2).

FIGS. 5A to 5C are bar graphs illustrating the capacitance in the 11th to 13th rows from the top, in the area of 20 rows aligned in the vertical direction×24 columns aligned in the horizontal direction of FIGS. 3A and 3B. The method of representation of capacitance in FIGS. 5A to 5C is the same as that in FIGS. 4A to 4C.

In row 11, a capacitance exceeding the second threshold (2) is obtained, but in columns 10 to 12, which are enclosed by a square of dashed lines, both the touch switches 114 and 115 exceed the first threshold (1), but both do not exceed the second threshold (2).

In row 12, a capacitance exceeding the second threshold (2) is obtained, but in columns 9 to 12, which are enclosed by a square of dashed lines, both the touch switches 114 and 115 exceed the first threshold (1), but both do not exceed the second threshold (2).

In row 13, no capacitance that exceeds the second threshold (2) is obtained, and in columns 10 and 11, which are enclosed by a square of dashed lines, both the touch switches 114 and 115 exceed the first threshold (1), but both do not exceed the second threshold (2).

As illustrated in FIGS. 4A to 5C, even by using the first threshold (1) and the second threshold (2) having a larger value than the first threshold (1), there may be cases where capacitance exceeding the second threshold (2) is not obtained in both the touch switches 114 and 115. In this case, there will be a gray zone (uncertain zone) around the boundary between the touch switches 114 and 115, where it is not possible to determine which touch switch is operated.

Figure 6A:
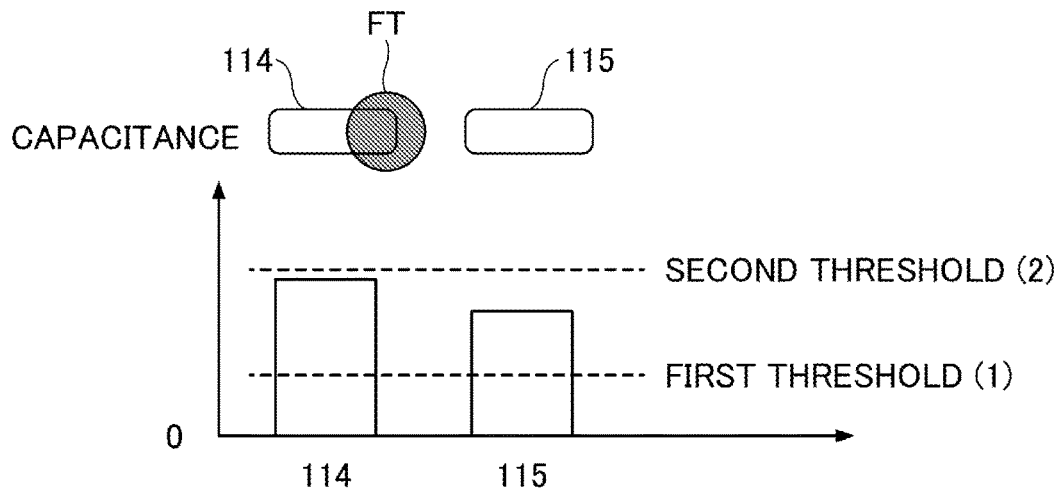
FIGS. 6A to 6C are diagrams illustrating a determination by a determination process for comparison according to an embodiment.
Figure 6B:
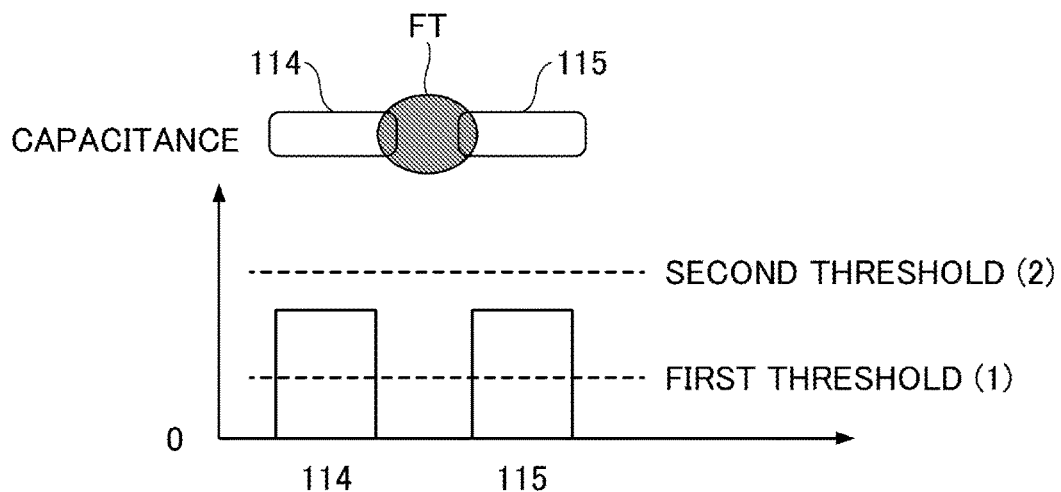
Figure 6C:
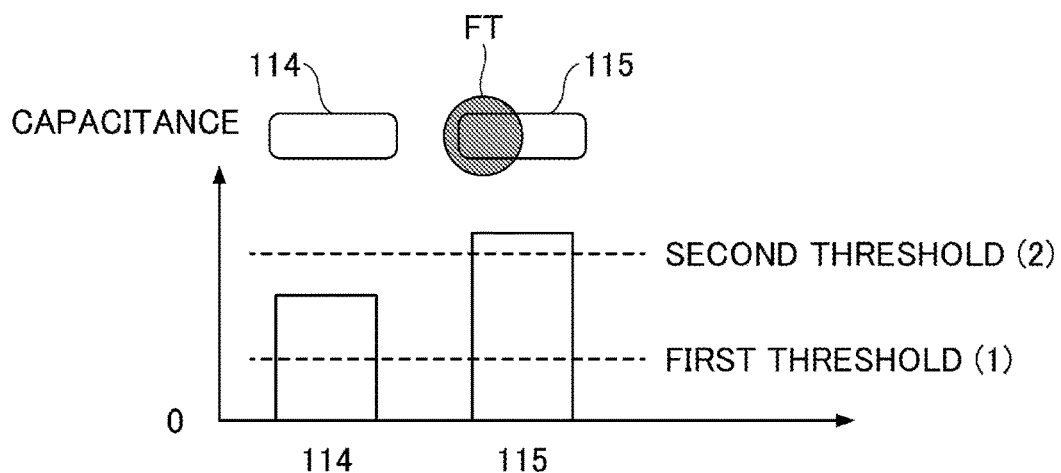

FIGS. 6A to 6C are diagrams illustrating determination in a determination process for comparison. FIGS. 6A to 6C illustrate, in a simplified manner, the touch switches 114 and 115 and the capacitance obtained at the touch switches 114 and 115.

FIG. 6A illustrates a capacitance when a fingertip FT is touching an area that is close to the touch switch 115, in the area of the touch switch 114. This position of the fingertip FT may be a position during the movement of the fingertip FT from the touch switch 114 toward the touch switch 115. The capacitance of the touch switch 114 exceeds the first threshold (1) but is less than the second threshold (2), and the capacitance of the touch switch 115 is less than the capacitance of the touch switch 114 but exceeds the first threshold (1) and is less than the second threshold (2). In this case, it is determined that the touch operation has been performed on the touch switch 114 for which the capacitance had exceeded the first threshold (1) first in chronological order.

FIG. 6B illustrates the capacitance when the fingertip FT is in contact with both the touch switches 114 and 115. This situation can occur when the fingertip FT moves from touch switch 114 toward the touch switch 115 or when the fingertip FT moves from the direction of the touch switch 111 or 112 or from the direction of the touch switch 117 or 118 toward the touch switches 114 and 115. The capacitance values of touch switches 114 and 115 both exceed the first threshold (1). In such a case, it is not possible to determine which of the touch switches 114 and 115 the touch operation is being performed on.

FIG. 6C illustrates a capacitance when the fingertip FT is touching the touch switch 115 but not the touch switch 114. The capacitance of the touch switch 114 exceeds the first threshold (1), but is less than the second threshold (2), and the capacitance of the touch switch 115 exceeds the second threshold (2). In this case, it is determined that a touch operation is performed on the touch switch 115. However, in such a situation, the capacitance may differ when the glove is fitted over the hand, and the capacitance may differ depending on the individual.

As described above, in the comparison determination process using the two levels of thresholds based on the two thresholds, i.e., the first threshold (1) and the second threshold (2), when the fingertip FT is positioned at the boundary between the two touch switches as illustrated in FIG. 6B, there is a problem that it is not possible to determine which of the two touch switches the touch operation is being performed on. This problem is significant in the area enclosed by a square of dashed lines near the boundary of the touch switches 114 and 115 in FIGS. 4A to 5C, and this problem may arise at the boundaries of adjacent touch switches in all of the touch switches 111 to 119.

Therefore, in the determination process by the determining unit 123 of the embodiment, such a problem is solved. Hereinafter, the determination process by the determining unit 123 of the embodiment will be described with reference to FIGS. 7A to 12. In the determination process by the determining unit 123 of the embodiment, at least three thresholds (a first threshold (1), a second threshold (2), and a third threshold (3)) are used to identify the touch switch on which a touch operation is performed. The second threshold (2) and the third threshold (3) among the at least three thresholds are examples of a plurality of comparison thresholds, and are examples of a plurality of comparison thresholds that are greater than the first threshold and that are different from each other. The third threshold (3) is an example of the largest of the plurality of comparison thresholds. The second threshold (2) used here differs from the second threshold (2) used for comparison described above. Details are given below.

FIGS. 7A and 7B are diagrams illustrating a threshold used in the determination process of the capacitance type input apparatus 100 according to the embodiment. FIGS. 7A and 7B illustrate, in gray, areas where the capacitance exceeds the first threshold (1) when a touch operation is performed on the touch switches 114 and 115. That is, the gray area represents the area corresponding to the first threshold (1).

The first threshold (1) in the embodiment is a low value that enables the determination of whether a touch operation is performed even when a touch operation is performed by using the fingertip FT of the gloved hand H, similar to the first threshold (1) in the comparison determination process.

The first threshold (1) is a value based on a count value (an example of a sensor value) of the capacitance detected at the touch switch on which the operation is performed when the hand H (see FIG. 1), as an example of an operating body, operates the outer edge or the vicinity of the outer edge of the touch switch.

The outer edge of the touch switch is the edge surrounding each touch switch, and the vicinity of the outer edge of the touch switch is the area inside and outside the outer edge of each touch switch and where a capacitance, that is equivalent to the capacitance at the outer edge, is obtained (for example, the difference is ±10% or less). In this way, the first threshold (1) is set so as to enable the determination of whether a touch operation is performed even when the hand H is gloved, and, therefore, the area corresponding to the first threshold (1) extends outside the outer edge of each touch switch.

The capacitance detected at each touch switch when touching each touch switch with the fingertip FT of the gloved hand H is smaller than the capacitance detected at each touch switch when touching each touch switch with the bare hand. This is because the distance between the touch switch and the fingertip FT is increased by the thickness of the glove. Therefore, the first threshold (1) is smaller than the threshold that enables the determination of whether a touch operation is performed by a bare hand, and the area corresponding to the first threshold (1) is larger than the area corresponding to the threshold that enables the determination of whether a touch operation is performed by a bare hand.

The second threshold (2) of the determination process by the determining unit 123 of the embodiment is a value higher than the first threshold (1), similar to the second threshold (2) used for the comparison described above. However, with respect to the touch switches 114 and 115, the second threshold (2) used here corresponds to the area indicated by the dashed line inside the gray area, which is the different point from the second threshold (2) used for the comparison. That is, in the determination process by the determining unit 123 of the embodiment, the value of the second threshold (2) is set such that the capacitance exceeding the second threshold (2) can be obtained within the area indicated by the dashed line. The area indicated by the dashed line corresponding to the second threshold (2) is the area on the center side excluding the portion close to the outer edge of the gray area corresponding to the first threshold (1). That is, the second threshold (2) is greater than the first threshold (1).

The third threshold (3) in the determination process by the determining unit 123 according to the embodiment corresponds to the area indicated by a dashed-dotted line inside the gray area, with respect to the touch switches 114 and 115. That is, in the determination process by the determining unit 123 of the embodiment, the third threshold (3) is set such that the capacitance exceeding the third threshold (3) can be obtained within the area indicated by the dashed-dotted line.

The area indicated by the dashed-dotted line corresponding to the third threshold (3) is included in the area indicated by the dashed line corresponding to the second threshold (2) and is the area around the center of the area indicated by the dashed line. In order to make it possible to determine that the touch operation is performed more near the center by using the third threshold (3), more precisely than the case of the determination based on the second threshold (2), the area indicated by the dashed-dotted line corresponding to the third threshold (3) is located around the center of the area indicated by the dashed line corresponding to the second threshold (2). That is, the third threshold (3) is greater than the second threshold (2).

The third threshold (3) is a value based on the sensor value detected at the operated touch switch when the hand H or the fingertip FT operates the center area of the touch switch. The area indicated by the dashed-dotted line corresponding to the third threshold (3) is an example of the center area of the touch switches 114 and 115.

When the above three thresholds, that is, the first threshold (1), the second threshold (2), and the third threshold (3) are used, the second threshold (2) may be set as a value between the first threshold (1) and the third threshold (3). For example, the second threshold (2) may be an intermediate value between the first threshold (1) and the third threshold (3) or the second threshold (2) may be obtained by multiplying the third threshold (3) by a predetermined percentage.

The first threshold (1) and the third threshold (3) may be set based on the detection sensitivity of the touch switch, the area (size) of the touch switch, or the distance between a touch switch and an adjacent touch switch. The detection sensitivity is expressed as the magnitude of the capacitance of the touch switch with respect to a touch operation. If the capacitance of the touch switch with respect to a touch operation is high, the detection sensitivity is high. If the capacitance of the touch switch with respect to a touch operation is low, the detection sensitivity is low.

FIGS. 7A and 7B illustrate areas corresponding to the three thresholds, that is, the first threshold (1), the second threshold (2), and the third threshold (3) with respect to the touch switches 114 and 115, but the same applies to the touch switches 111 to 113 and 116 to 119.

In the determination process by the determining unit 123 of the embodiment, for each of the touch switches 111 to 119, at least three thresholds are used to identify the touch switch on which a touch operation is performed. Hereinafter, as an example, a determination process for identifying the touch switch on which a touch operation is performed, by using three thresholds, that is, the first threshold (1), the second threshold (2), and the third threshold (3), will be described.

Figure 8A:
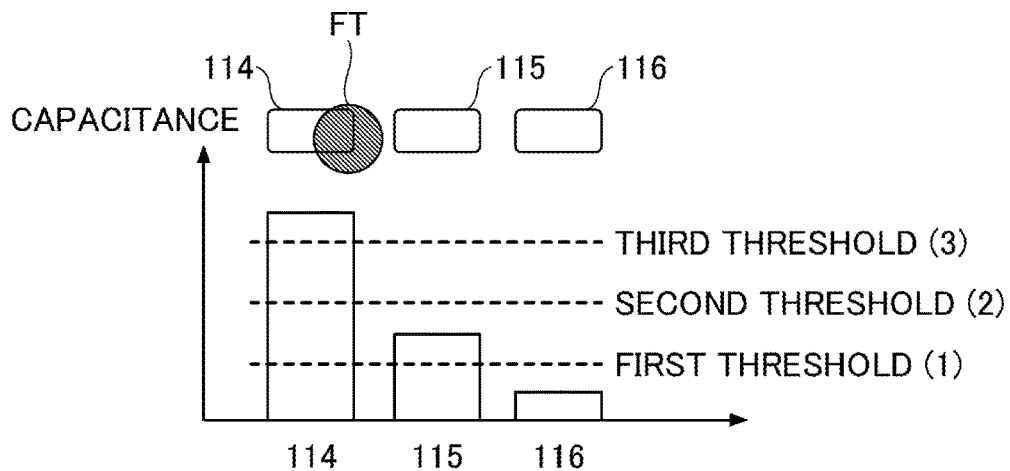
FIGS. 8A to 8C are diagrams illustrating a determination process of the determining unit according to an embodiment.
Figure 8B:
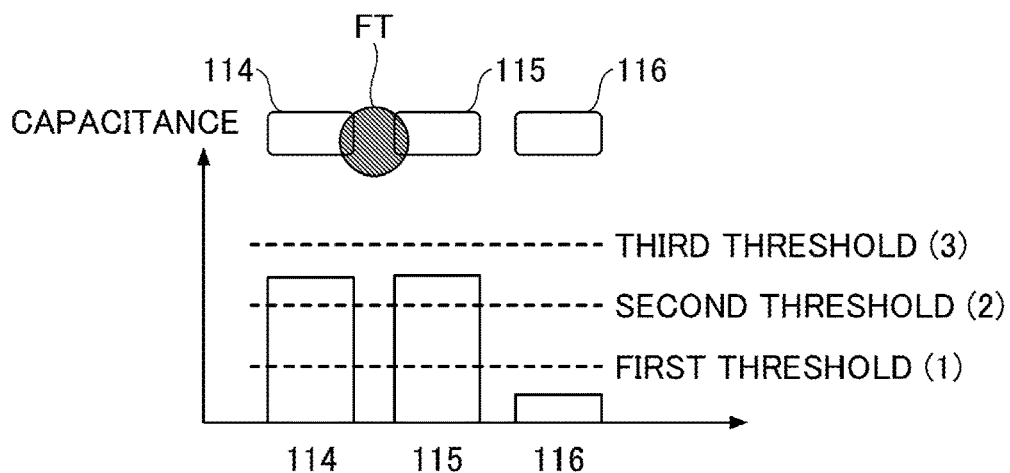
Figure 8C:
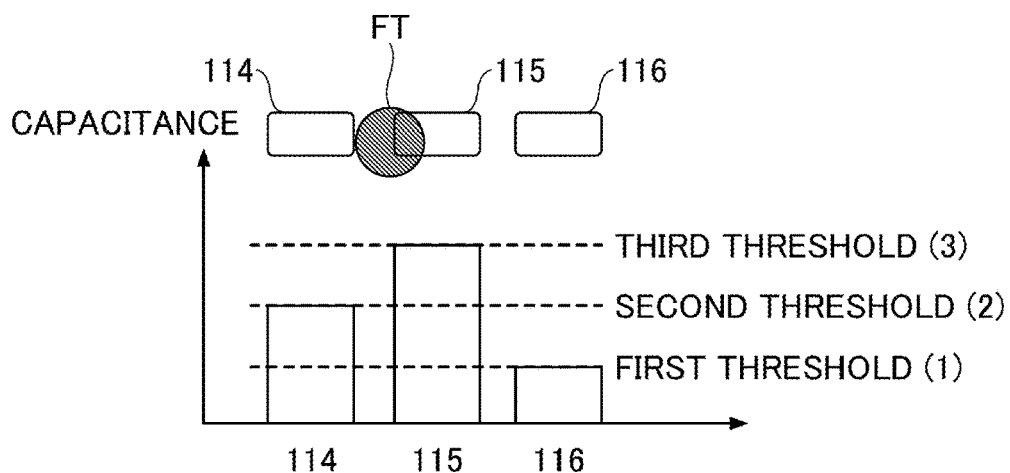

FIGS. 8A to 8C are diagrams illustrating a determination process by the determining unit 123 according to an embodiment. FIGS. 8A to 8C illustrate the touch switches 114 to 116 in a simplified manner and the capacitance obtained at the touch switches 114 to 116.

FIG. 8A illustrates the capacitance when the fingertip FT is touching the touch switch 114 but the fingertip FT is close to the touch switch 115. This position of the fingertip FT may be a position during the movement of the fingertip FT from the touch switch 114 toward the touch switch 115. The capacitance at the touch switch 114 exceeds the third threshold (3), the capacitance at the touch switch 115 exceeds the first threshold (1) and is less than the second threshold (2), and the capacitance at the touch switch 116 is less than the first threshold (1). As described above, when there is only one touch switch at which the capacitance exceeds the third threshold (3), it is determined that a touch operation is performed on the touch switch 114 at which the capacitance exceeds the third threshold (3). The touch switch 114 at which the capacitance exceeds the third threshold (3) is an example of a touch switch corresponding to the capacitance (output) exceeding the third threshold (3). The fact that there is only one touch switch at which the capacitance exceeds the third threshold (3) is an example that there is one output exceeding the third threshold (3). In this case, the capacitance of the touch switch 114 is an example of one output. Determining that a touch operation is performed on the touch switch 114 is an example of extracting one output.

When the fingertip FT spans a plurality of touch switches and the fingertip FT touches a plurality of touch switches, the third threshold (3) is to be set to a value that is not exceeded by the capacitance of the plurality of touch switches.

FIG. 8B illustrates the capacitance when the fingertip FT is touching both the touch switches 114 and 115. This situation may occur when the fingertip FT moves from the touch switch 114 toward the touch switch 115. The capacitance values of the touch switches 114 and 115 are both less than or equal to the third threshold (3) and above the second threshold (2). In this case, it is determined that the touch operation had been performed on the touch switch 114 at which the capacitance had exceeded the first threshold (1) first in chronological order. A state in which the capacitance of both the touch switches 114 and 115 is less than or equal to the third threshold (3) and exceeds the second threshold (2) is an example of a state in which two outputs are less than or equal to one of the plurality of comparison thresholds, and the capacitance of the touch switches 114 and 115 is an example of the two outputs.

Even when the capacitance of both the touch switches 114 and 115 is less than or equal to the second threshold (2) and exceeds the first threshold (1), it may be determined that the touch operation is performed on the touch switch at which the capacitance had exceeded the first threshold (1) first in chronological order.

FIG. 8C illustrates the capacitance when the fingertip FT is touching the touch switch 115 but is almost touching the touch switch 114. This position of the fingertip FT may be a position during the movement of the fingertip FT from the touch switch 114 toward the touch switch 115. The capacitance of the touch switch 115 exceeds the third threshold (3), the capacitance of the touch switch 114 exceeds the second threshold (2) and is less than or equal to the third threshold (3), and the capacitance of the touch switch 116 is less than or equal to the first threshold (1). As described above, when there is only one touch switch at which the capacitance exceeds the third threshold (3), it is determined that a touch operation is performed on the touch switch 115 at which the capacitance exceeds the third threshold (3).

The determination process described with reference to FIGS. 8A to 8C is a part of the determination process by the determining unit 123. The determining unit 123 performs the following determination process.

When there is only one touch switch at which the capacitance exceeds the third threshold (3), the determining unit 123 determines that a touch operation is performed on the touch switch at which the capacitance exceeds the third threshold (3).

When there is only one touch switch at which the capacitance exceeds the second threshold (2), the determining unit 123 determines that a touch operation is performed on the touch switch at which the capacitance exceeds the second threshold (2).

When there is only one touch switch at which the capacitance exceeds the first threshold (1), the determining unit 123 determines that a touch operation is performed on the touch switch at which the capacitance exceeds the first threshold (1).

When there are a plurality of touch switches at which the capacitance exceeds the first threshold (1) in a case other than the above-described cases, the determining unit 123 determines as follows.

When the capacitance of all of the touch switches is less than the third threshold (3) and there are a plurality of touch switches at which the capacitance exceeds the second threshold (2), the determining unit 123 determines that a touch operation is performed on the touch switch at which the capacitance had exceeded the second threshold (2) first (earliest) in chronological order.

When the capacitance of all of the touch switches is less than the second threshold (2), and there are a plurality of touch switches at which the capacitance exceeds the first threshold (1), it is determined that a touch operation is performed on the touch switch at which the capacitance had exceeded the first threshold (1) first (earliest) in chronological order.

When there are a plurality of touch switches at which the capacitance exceeds the third threshold (3), the determining unit 123 determines that a touch operation is performed on the touch switch at which the capacitance had exceeded the third threshold (3) first (earliest) in chronological order. The third threshold (3) is set to a value that is not exceeded by the capacitance of the plurality of touch switches when the fingertip FT is touching the plurality of touch switches. However, for example, if a plurality of fingers, the palm, or the like touches a plurality of touch switches, there may be a plurality of touch switches at which the capacitance exceeds the third threshold (3). For this reason, when there are a plurality of touch switch at which the capacitance exceeds the third threshold (3), the determining unit 123 may determine that a touch operation is performed on the touch switch at which the capacitance had exceeded the third threshold (3) first (earliest) in chronological order.

When there is no touch switch at which the capacitance exceeds the first threshold (1), the determining unit 123 determines that a touch operation is not performed on any of the touch switches. Here, a method of determining that a touch operation is performed on the touch switch at which the capacitance had exceeded the threshold first (earliest) in chronological order is described; however, it may be determined that a touch operation is performed on the touch switch at which the capacitance had exceeded the threshold last (latest) in chronological order.

Figure 9:
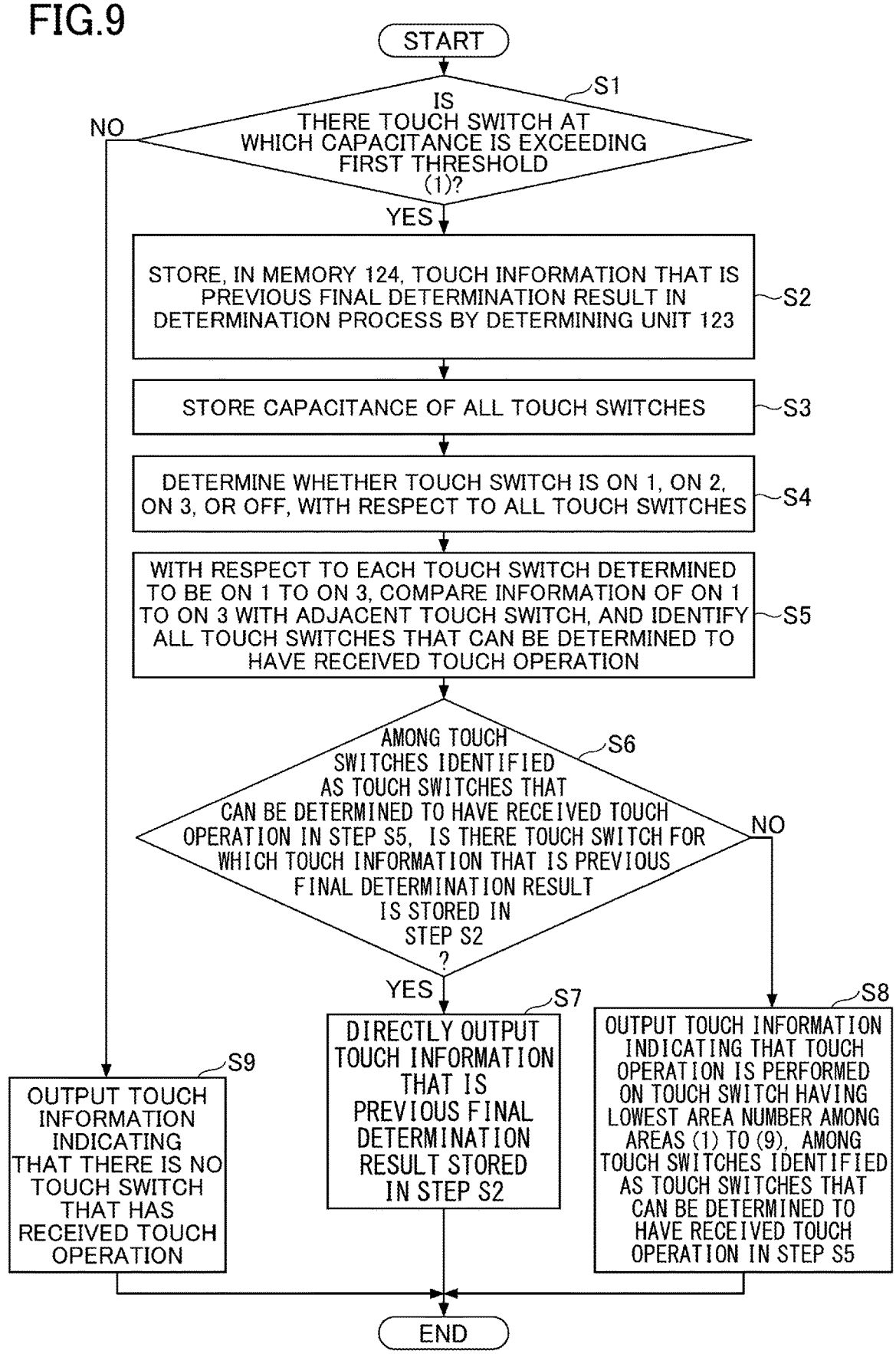
FIG. 9 is a flowchart illustrating a determination process performed by the determining unit according to an embodiment.

FIG. 9 is a diagram illustrating a flowchart illustrating a determination process performed by the determining unit 123. The flowchart illustrated in FIG. 9 illustrates a process by the capacitance type input method of the embodiment. The determining unit 123 repeatedly performs the series of processes from the start to the end of the flow illustrated in FIG. 9 at a predetermined control cycle while the power of the capacitance type input apparatus 100 is turned on. The power of the capacitance type input apparatus 100 is turned on, for example, when the ignition switch of the vehicle in which the capacitance type input apparatus 100 is mounted, is in an accessory mode or is turned on.

In step S1, the determining unit 123 acquires the capacitance of all of the touch switches 111 to 119 and determines whether there is a touch switch at which the capacitance exceeds the first threshold (1). The determining unit 123 performs the process of step S1 by comparing the capacitance of all of the touch switches 111 to 119 with the first threshold (1). The process in step S1 is an example of the first comparison, and the result of the process in step S1 is an example of the comparison result of the first comparison.

In step S1, the determining unit 123 acquires the capacitance of all of the touch switches 111 to 119 from the capacitance detecting unit 122. The capacitance detecting unit 122 detects the capacitance of the touch switches 111 to 119 by selecting the touch switches 111 to 119 one by one in chronological order.

When it is determined that there is a touch switch at which the capacitance exceeds the first threshold (1) (step S1: YES), the determining unit 123 stores the touch information as the result of the previous final determination in the determination process by the determining unit 123 (the flowchart of FIG. 9) with respect to all of the touch switches 111 to 119 in a predetermined area of the memory 124 (step S2). The touch information is information indicating which touch switch has been determined to be the touch switch on which a touch operation has been performed (i.e., the touch switch that has received a touch operation) at the end of the flowchart in FIG. 9. In the initial flow, there is no touch information because there is no final determination result of a previous flow. When it is determined that all of the touch switches 111 to 119 have not received a touch operation, the touch information indicates that all of the touch switches 111 to 119 have not received a touch operation.

In step S3, the determining unit 123 stores the capacitance of all of the touch switches 111 to 119 in the memory 124.

In step S4, the determining unit 123 determines, with respect to all of the touch switches 111 to 119, as to whether the capacitance of each touch switch exceeds the first threshold (1) (ON 1), exceeds the second threshold (2) (ON 2), exceeds the third threshold (3) (ON 3), or is less than or equal to the first threshold (1) (OFF). The process of determining whether the second threshold (2) is exceeded (ON 2) and the process of determining whether the third threshold (3) is exceeded (ON 3) are one example of the second comparison, and the result of this process is one example of the comparison result of the second comparison. The determining unit 123 determines that the state of the touch switch at which the capacitance exceeds the first threshold (1) and the capacitance exceeds the second threshold (2) is ON 2. The determining unit 123 determines that the state of the touch switch at which the capacitance exceeds the second threshold (2) and the capacitance exceeds the third threshold (3) is ON 3. Therefore, with respect to a touch switch at which the capacitance exceeds the first threshold (1), it is determined that the state of the touch switch is one of ON 1, ON 2, or ON 3.

In step S5, with respect to the touch switches for which the state is determined to be ON 1, ON 2, or ON 3 in step S4, the determining unit 123 compares the information of ON 1, ON 2, and ON 3 between adjacent touch switches, and identifies all of the touch switches that can be determined to have received a touch operation.

In step S6, among the touch switches that have been identified as touch switches that can be determined to have received a touch operation in step S5, the determining unit 123 determines whether there is a touch switch that has been determined to have received a touch operation by the touch information as the previous final determination result stored in step S2.

When it is determined that there is a touch switch that has been determined to have received a touch operation (step S6: YES), in step S7, the determining unit 123 directly outputs the touch information as the result of the previous final determination stored in step S2. When the process in step S7 is completed, the determining unit 123 ends the series of processes (END).

In step S6, when it is determined that there is no touch switch that has been determined to have received a touch operation in step S2 (step S6: NO), in step S8, the determining unit 123 outputs touch information indicating that a touch operation has been performed on the touch switch having the lowest area number among the areas (1) to (9) among the touch switches identified in step S5. As an example, as illustrated in FIG. 1, when operating the touch switches 111 to 119 with the thumb of the right hand H holding the spoke of the steering wheel 10, the touch switch farthest from the thumb is the touch switch 111, the touch switch nearest to the thumb is the touch switch 119, and the touch switches become closer to the thumb in the order of the touch switches 111 to 119. Accordingly, when a touch operation is simultaneously performed on the touch switches, it is determined that a touch operation is performed on the touch switch far from the thumb with priority. This order of determination is one example. For example, as described in FIG. 8, it may be determined that the touch switch at which the capacitance exceeds the first threshold (1), the second threshold (2), or the third threshold (3) first (earliest) in chronological order, is the touch switch on which the touch operation is performed.

In step S1, when it is determined that there is no touch switch at which the capacitance exceeds the first threshold (1) (step S1: NO), in step S9, the determining unit 123 outputs touch information indicating that there is no touch switch on which a touch operation is performed.

Figure 10:
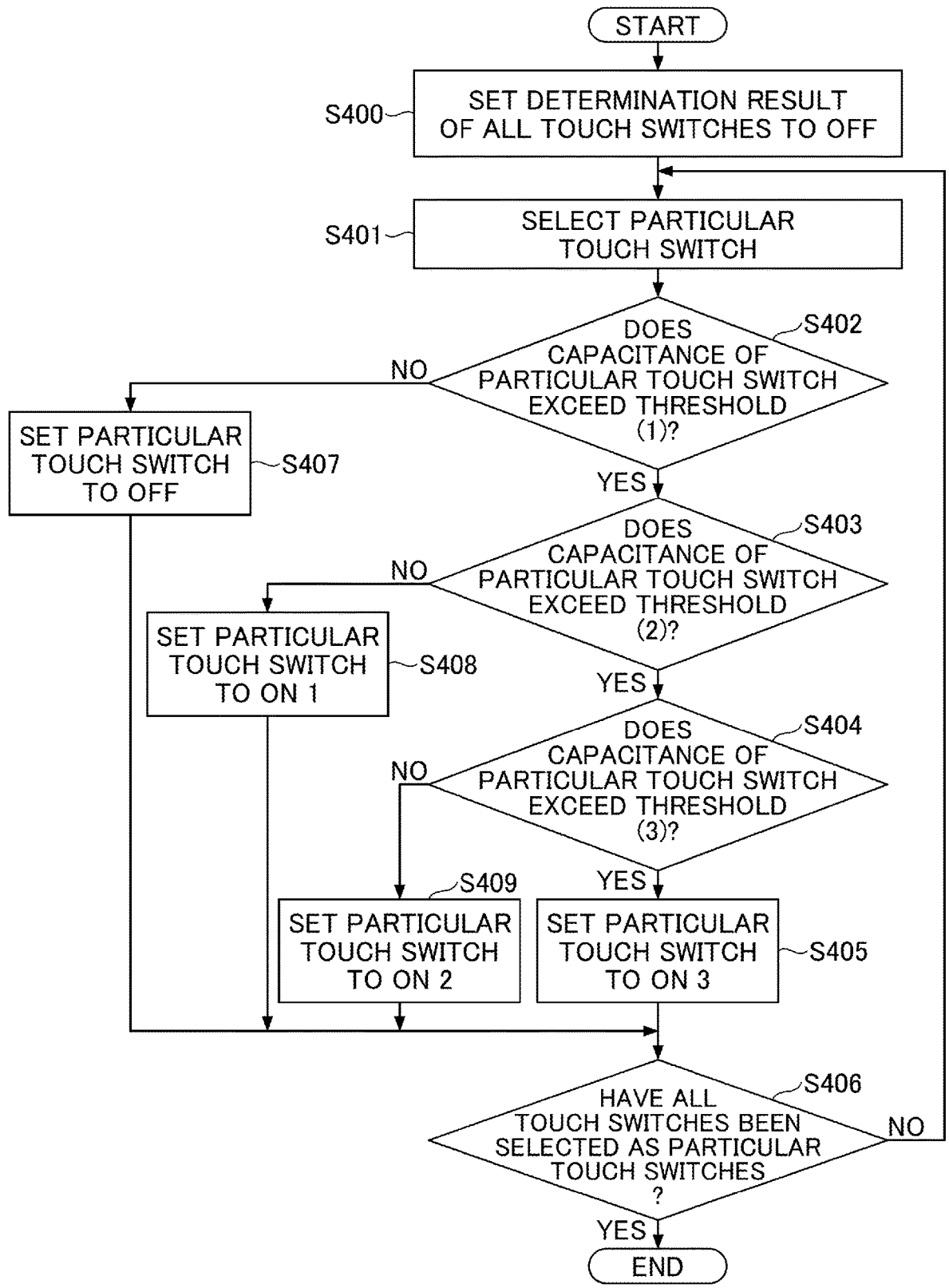
FIG. 10 is a flowchart illustrating the detailed process in step S4 according to an embodiment.

FIG. 10 is a flowchart illustrating a detailed process of step S4. The process illustrated in FIG. 10 includes steps S400 to S409.

In step S400, the determining unit 123 sets the determination results of all of the touch switches 111 to 119 to OFF.

In step S401, the determining unit 123 selects one particular touch switch from among all of the touch switches 111 to 119. Here, any one of the touch switches 111 to 119 may be selected as a particular touch switch. In order to select all of the touch switches 111 to 119 as a particular touch switch once by repeating the processes in steps S401 to S409 nine times, for example, the touch switches 111 to 119 may be selected in sequential order. The output of a particular touch switch is an example of a particular output. The output of a touch switch other than the particular touch switch is an example of a non-particular output other than a particular output.

In step S402, the determining unit 123 determines whether the capacitance of the particular touch switch exceeds the first threshold (1).

When it is determined that the capacitance of the particular touch switch exceeds the first threshold (1) (step S402: YES), in step S403, the determining unit 123 determines whether the capacitance of the particular touch switch exceeds the second threshold (2).

When it is determined that the capacitance of the particular touch switch exceeds the second threshold (2) (step S403: YES), in step S404, the determining unit 123 determines whether the capacitance of the particular touch switch exceeds the third threshold (3). By performing the processes in steps S402 to S404, the determining unit 123 determines whether the capacitance of the particular touch switch exceeds any of the comparison thresholds.

When it is determined that the capacitance of the particular touch switch exceeds the third threshold (3) (step S404: YES), in step S405, the determining unit 123 sets the determination result of the particular touch switch to ON 3.

In step S406, the determining unit 123 determines whether all of the touch switches 111 to 119 have been selected as particular touch switches.

When it is determined that all of the touch switches 111 to 119 are not selected as particular touch switches (step S406: NO), the determining unit 123 returns the flow to step S401. This is to select a new particular touch switch and execute the processes in step S401 to step S409 repeatedly.

When it is determined in step S402 that the capacitance of the particular touch switch does not exceed the first threshold (1) (step S402: NO), in step S407, the determining unit 123 sets the determination result of the particular touch switch to OFF.

When it is determined that the capacitance of the particular touch switch does not exceed the second threshold (2) (step S403: NO), in step S408, the determining unit 123 sets the determination result of the particular touch switch to ON 1.

When it is determined that the capacitance of the particular touch switch does not exceed the third threshold (3) (step S404: NO), in step S409, the determining unit 123 sets the determination result of the particular touch switch to ON 2.

Figure 11:
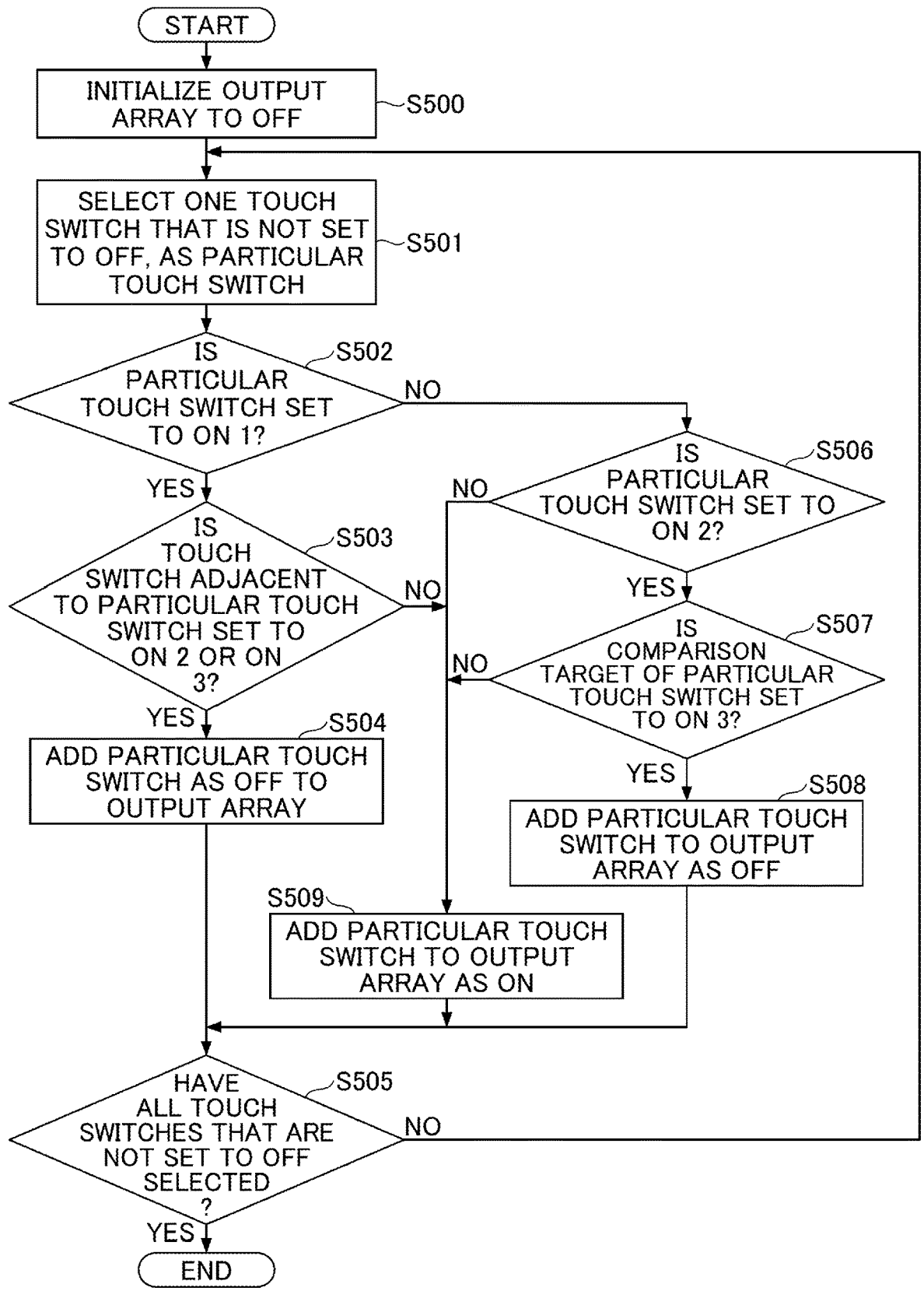
FIG. 11 is a flowchart illustrating the detailed process in step S5 according to an embodiment.

FIG. 11 is a flowchart illustrating a detailed process of step S5. The process illustrated in FIG. 11 includes steps S500 to S509.

In step S500, the determining unit 123 initializes an output array to be turned off with respect to a touch switch that is determined to be ON 1, ON 2, and ON 3 in step S4. The output array is stored in a predetermined area in which the determination result in step S5 is stored, apart from the area storing the determination result of ON 1, ON 2, ON 3, and OFF obtained in step S4, among the areas of the memory 124.

In step S501, the determining unit 123 selects one touch switch among the touch switches that is not determined to be OFF in step S4, as a particular touch switch.

In step S502, the determining unit 123 determines whether the particular touch switch is set to ON 1.

When it is determined that the particular touch switch is set to ON 1 (step S502: YES), in step S503, the determining unit 123 determines whether an adjacent touch switch of the particular touch switch is set to ON 2 or ON 3.

When it is determined that the touch switch adjacent to the particular touch switch is set to ON 2 or ON 3 (step S503: YES), in step S504, the determining unit 123 adds the state of the particular touch switch to the output array as the OFF state.

In step S505, the determining unit 123 determines whether all of the touch switches that are not set to OFF have been selected in step S4. When the determining unit 123 determines that all of the touch switches have been selected (step S505: YES), the determining unit 123 advances the flow to step S6.

When it is determined in step S502 that the particular touch switch is not set to ON 1 (step S502: NO), in step S506, the determining unit 123 determines whether the particular touch switch is set to ON 2.

When it is determined that the particular touch switch is set to ON 2 (step S506: YES), in step S507, the determining unit 123 determines whether a touch switch adjacent to the particular touch switch is set to ON 3.

When it is determined that the touch switch adjacent to the particular touch switch is set to ON (step S507: YES), in step S508, the determining unit 123 adds the state of the particular touch switch to the output array as an OFF state.

When it is determined in step S506 that the particular touch switch is not set to ON 2 (step S506: NO), or when it is determined in step S507 that a touch switch adjacent to the particular touch switch is not set to ON 3 (step S507: NO), in step S509, the determining unit 123 adds a state of the particular touch switch to the output array as an ON state.

As described above, the touch switch on which a touch operation is performed among the touch switches 111 to 119, is determined.

Figure 12:
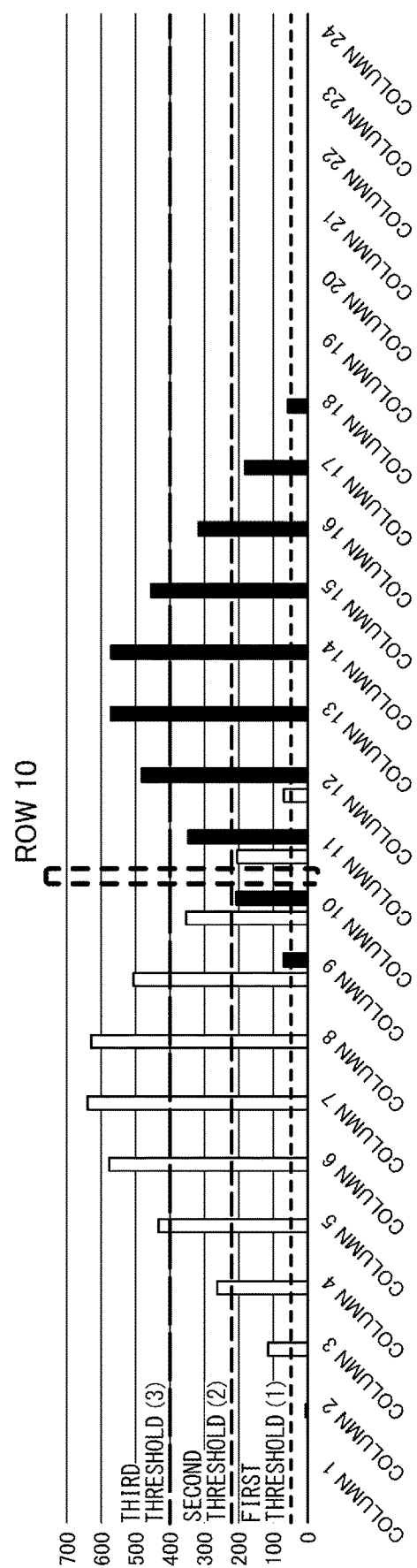
FIG. 12 is a diagram illustrating the relationship between the distribution of capacitance and the first threshold (1), the second threshold (2), and the third threshold (3) according to an embodiment.

FIG. 12 is a diagram illustrating the relationship between the distribution of capacitance and the first threshold (1), the second threshold (2), and the third threshold (3). FIG. 12 illustrates a white bar graph illustrating the capacitance when a touch operation is performed on the touch switch 114 illustrated in FIG. 3A, a black bar graph illustrating a capacitance when a touch operation is performed on the touch switch 115 illustrated in FIG. 3B, and a first threshold (1), a second threshold (2), and a third threshold (3). The white and black bars illustrated in FIG. 12 are identical to the white and black bars illustrated in FIG. 4B.

As illustrated in FIG. 12, the capacitance exceeding the third threshold (3) is obtained in columns 5 to 9 corresponding to the center portion in the horizontal direction of the touch switch 114, and capacitance exceeding the third threshold (3) is obtained in columns 12 to 15 corresponding to the center portion in the horizontal direction of the touch switch 115. With respect to the 10th row and the 11th row, which correspond to the boundary between the touch switch 114 and the touch switch 115, in the 10th row, the capacitance of the touch switch 114 exceeds the second threshold (2), but the capacitance of the touch switch 115 does not exceed the second threshold (2). In the 11th row, the capacitance of the touch switch 114 does not exceed the second threshold (2), but the capacitance of the touch switch 115 exceeds the second threshold (2).

Accordingly, the capacitance type input apparatus 100 that can determine which one of a plurality of touch switches has received a touch operation, can be provided. The capacitance type input apparatus 100 enables the comparison of the levels of detection sensitivity (electrostatic sensitivity) in fine areas by setting multiple thresholds, and as a result, it is possible to efficiently determine when a sliding operation of the finger is performed.

In the above, examples of a plurality of comparison thresholds are the second threshold (2) and the third threshold (3), and the determining unit 123 determines which one of the touch switches 111 to 119 has received a touch operation by using the three thresholds, i.e., the first threshold (1), the second threshold (2), and the third threshold (3). However, the number of the plurality of comparison thresholds may be three or more. That is, the determining unit 123 may use four or more thresholds to determine which one of the touch switches 111 to 119 has received a touch operation.

Further, although the configuration in which the operation unit 110 includes nine touch switches 111 to 119 has been described, as long as the operation unit 110 includes a plurality of touch switches, any number of touch switches may be included as long as there are two or more touch switches.

Further, as described above, the embodiment in which the first threshold (1) is a low value that enables the determination of whether a touch operation is performed even when a glove is fitted over the hand H has been described. However, it is sufficient as long as the first threshold (1) is a value that enables detection of whether a touch operation is performed even when the capacitance of the touch switch is lower than that when a touch operation performed with the bare hand, and the first threshold (1) is not to limited being a low value that enables determination of whether a touch operation is performed even when a glove is fitted over the hand H.

According to an aspect of the present invention, a capacitance type input apparatus and a capacitance type input method capable of determining which one of a plurality of touch switches a touch operation is performed on, can be provided.

Although the capacitance type input apparatus and the capacitance type input method according to the embodiments of the present invention have been described as above, the present invention is not limited to specifically disclosed embodiments, and various modifications and changes may be made without departing from the scope of the claims.

What is claimed is:

1. A capacitance type input apparatus comprising:
a plurality of touch switches; and
a determining unit configured to determine which one touch switch among the plurality of touch switches a touch operation is performed on, based on outputs of the plurality of touch switches, wherein
the determining unit
performs a first comparison of comparing a first threshold used for determining whether the touch operation has been performed, with each of the outputs of the plurality of touch switches,
performs a second comparison of comparing an output that is higher than the first threshold among the outputs of the plurality of touch switches, with a plurality of comparison thresholds that are greater than the first threshold and that are different from each other, and
determines which one touch switch among the plurality of touch switches the touch operation is performed on, based on a comparison result obtained by the first comparison or the second comparison.

2. The capacitance type input apparatus according to claim 1, wherein the first threshold is a value based on a sensor value detected at the plurality of touch switches when an operating body operates an outer edge or a vicinity of the outer edge of each of the plurality of touch switches.

3. The capacitance type input apparatus according to claim 1, wherein the plurality of touch switches are switches provided on a steering wheel of a vehicle.

4. The capacitance type input apparatus according to claim 1, wherein
in response to determining, as a result of the second comparison, that there are two outputs that are less than or equal to any of the plurality of comparison thresholds among the outputs, and that the two outputs are both within a range between two common comparison thresholds that are adjacent to each other among the plurality of comparison thresholds or within a range between a lowest comparison threshold among the plurality of comparison thresholds and the first threshold,
the determining unit determines that the touch operation is performed on a touch switch corresponding to an output that is obtained first between the two outputs or an output obtained last between the two outputs, among the plurality of touch switches.

5. The capacitance type input apparatus according to claim 4, wherein
in response to determining that there area plurality of outputs that are higher than the first threshold among the outputs of the plurality of touch switches as a result of the second comparison,
with respect to each of the plurality of outputs, the determining unit
selects one output among the plurality of outputs as a particular output, and
determines whether the selected particular output is less than or equal to any of the plurality of comparison thresholds and whether a non-particular output other than the selected particular output among the plurality of outputs is less than or equal to any of the plurality of comparison thresholds,
to thereby extract the two outputs that are less than or equal to any of the comparison thresholds.

6. The capacitance type input apparatus according to claim 1, wherein in response to determining that there is one output that exceeds any of the plurality of comparison thresholds among the outputs as a result of the second comparison, the determining unit determines that the touch operation is performed on a touch switch corresponding to the one output among the plurality of touch switches.

7. The capacitance type input apparatus according to claim 6, wherein a maximum comparison threshold among the plurality of comparison thresholds and the first threshold are set based on a detection sensitivity of the plurality of touch switches, an area of each of the plurality of touch switches, or a distance between adjacent touch switches among the plurality of touch switches.

8. The capacitance type input apparatus according to claim 6, wherein a maximum comparison threshold among the plurality of comparison thresholds is a value determined based on a sensor value detected at the plurality of touch switches when an operating body operates a center area of each of the plurality of touch switches.

9. The capacitance type input apparatus according to claim 6, wherein
in response to determining that there are a plurality of outputs that are higher than the first threshold among the outputs of the plurality of touch switches as a result of the second comparison,
with respect to each of the plurality of outputs, the determining unit
selects one output among the plurality of outputs as a particular output, and
determines whether the selected particular output exceeds any of the plurality of comparison thresholds and whether a non-particular output other than the selected particular output among the plurality of outputs does not exceed any of the plurality of comparison thresholds,
to thereby extract the one output that exceeds any of the comparison thresholds.

10. The capacitance type input apparatus according to claim 9, wherein the non-particular output is an output of a touch switch adjacent to a touch switch at which the particular output is obtained among the plurality of touch switches, among outputs other than the selected particular output among the plurality of outputs.

11. A capacitance type input method performed in a capacitance type input apparatus including a plurality of touch switches, the capacitance type input method comprising:
determining which one touch switch among the plurality of touch switches a touch operation is performed on, based on outputs of the plurality of touch switches, wherein
the determining includes
performing a first comparison of comparing a first threshold used for determining whether the touch operation has been performed, with each of the outputs of the plurality of touch switches,
performing a second comparison of comparing an output that is higher than the first threshold among the outputs of the plurality of touch switches, with a plurality of comparison thresholds that are greater than the first threshold and that are different from each other, and determining which one touch switch among the plurality of touch switches the touch operation is performed on, based on a comparison result obtained by the first comparison or the second comparison.

\* \* \* \* \*